(12) United States Patent
Fukushima et al.

(10) Patent No.: US 12,202,934 B2
(45) Date of Patent: Jan. 21, 2025

(54) CHARGE-TRANSPORT POLYMER AND ORGANIC ELECTRONIC ELEMENT

(71) Applicant: HITACHI CHEMICAL COMPANY, LTD., Tokyo (JP)

(72) Inventors: Iori Fukushima, Tokyo (JP); Hirotaka Sakuma, Tokyo (JP); Kenichi Ishitsuka, Tokyo (JP); Kazuyuki Kamo, Tokyo (JP); Shunsuke Kodama, Tokyo (JP); Tomotsugu Sugioka, Tokyo (JP); Tomomi Uchiyama, Tokyo (JP); Ryota Moriyama, Tokyo (JP); Ryo Honna, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 14 days.

(21) Appl. No.: 16/759,144

(22) PCT Filed: Oct. 27, 2017

(86) PCT No.: PCT/JP2017/038978
§ 371 (c)(1),
(2) Date: Apr. 24, 2020

(87) PCT Pub. No.: WO2019/082396
PCT Pub. Date: May 2, 2019

(65) Prior Publication Data
US 2021/0179771 A1  Jun. 17, 2021

(51) Int. Cl.
*C08G 61/12* (2006.01)
*C09D 11/102* (2014.01)
(Continued)

(52) U.S. Cl.
CPC .......... *C08G 61/12* (2013.01); *C08G 61/124* (2013.01); *C09D 11/102* (2013.01); *C09D 11/30* (2013.01);
(Continued)

(58) Field of Classification Search
None
See application file for complete search history.

(56) References Cited

U.S. PATENT DOCUMENTS

2008/0145571 A1   6/2008  Kobayashi et al.
2012/0074360 A1*  3/2012  Funyuu ............... H10K 85/113
                                                              524/610
(Continued)

FOREIGN PATENT DOCUMENTS

CN   101124259 A    2/2008
JP   2013-155294 A  8/2013
(Continued)

OTHER PUBLICATIONS

Machine language translation of JP 2013209300A (Year: 2013).*

*Primary Examiner* — Erik Kielin
(74) *Attorney, Agent, or Firm* — FITCH, EVEN, TABIN & FLANNERY, LLP

(57) ABSTRACT

One embodiment relates to a charge transport polymer containing a molecular chain and terminal groups bonded to the molecular chain, wherein the terminal groups include a terminal group P containing a polymerizable functional group and a terminal group EW containing an aromatic hydrocarbon group substituted with an electron-withdrawing substituent, the terminal group P includes a terminal group represented by formula (P1) shown below, and among the carbon atoms contained in the ring of the aromatic hydrocarbon group, if the carbon atom that is bonded to the
(Continued)

molecular chain is numbered 1, and numbers are assigned in order to the adjoining carbon atoms, then the electron-withdrawing substituent is bonded to a carbon atom numbered 1+2n (wherein n is an integer of 1 or greater).

$$*-(\mathrm{Ar})_a-[(\mathrm{L})_x-\mathrm{PG}]_y \quad (\mathrm{P1})$$

20 Claims, 1 Drawing Sheet

(51) Int. Cl.
    *C09D 11/30*     (2014.01)
    *C09D 11/52*     (2014.01)
    *G02F 1/13357*     (2006.01)
    *H10K 50/15*     (2023.01)
    *H10K 50/17*     (2023.01)
    *H10K 85/10*     (2023.01)

(52) U.S. Cl.
    CPC ........ *C09D 11/52* (2013.01); *G02F 1/133603* (2013.01); *H10K 85/111* (2023.02); *H10K 85/151* (2023.02); *C08G 2261/124* (2013.01); *C08G 2261/1412* (2013.01); *C08G 2261/148* (2013.01); *C08G 2261/18* (2013.01); *C08G 2261/228* (2013.01); *C08G 2261/312* (2013.01); *C08G 2261/3162* (2013.01); *C08G 2261/3241* (2013.01); *C08G 2261/334* (2013.01); *C08G 2261/51* (2013.01); *C08G 2261/95* (2013.01); *H10K 50/15* (2023.02); *H10K 50/17* (2023.02)

(56) References Cited

U.S. PATENT DOCUMENTS

| | | | |
|---|---|---|---|
| 2014/0231791 A1* | 8/2014 | Funyuu | C09D 11/52 |
| | | | 252/500 |
| 2019/0027689 A1* | 1/2019 | Funyuu | H10K 85/111 |

FOREIGN PATENT DOCUMENTS

| | | | | |
|---|---|---|---|---|
| JP | 2013209300 A | * | 10/2013 | |
| JP | 2014-167976 A | | 9/2014 | |
| JP | 2017-123438 A | | 7/2017 | |
| WO | 2010/140553 A1 | | 12/2010 | |
| WO | WO-2017119483 A1 | * | 7/2017 | ............. C09D 11/02 |

* cited by examiner

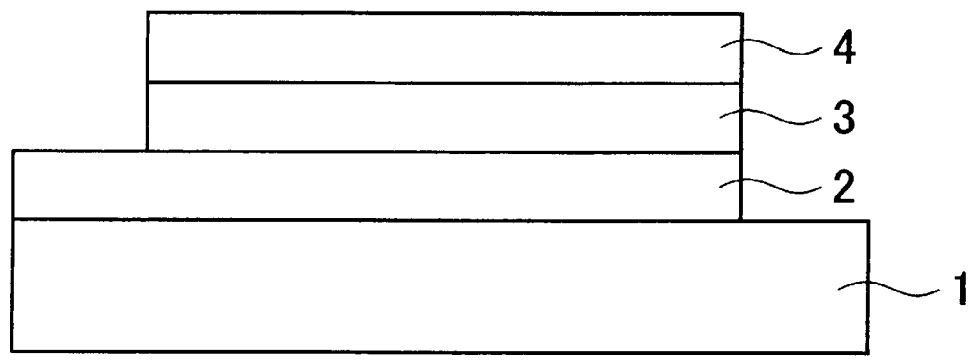

CHARGE-TRANSPORT POLYMER AND ORGANIC ELECTRONIC ELEMENT

CROSS-REFERENCE TO RELATED APPLICATIONS

This application is a U.S. national phase application filed under 35 U.S.C. § 371 of International Application No. PCT/JP2017/038978, filed Oct. 27, 2017, designating the United States, which is hereby incorporated herein by reference in its entirety.

TECHNICAL FIELD

The present invention relate to a charge transport polymer, a charge transport material, an ink composition, an organic layer, an organic electronic element, an organic electroluminescent element, a display element, an illumination device and a display device.

BACKGROUND ART

Organic electronic elements are elements which use an organic substance to perform an electrical operation, and it is anticipated that such organic electronic elements will be capable of providing advantages such as lower energy consumption, lower prices and greater flexibility, meaning organic electronic elements are attracting much attention as a potential alternative technology to conventional inorganic semiconductors containing mainly silicon.

Examples of organic electronic elements include organic electroluminescent elements (organic EL elements), organic photoelectric conversion elements, and organic transistors.

Among the various organic electronic elements, organic EL elements are attracting attention for potential use in large-surface area solid state lighting applications to replace incandescent lamps or gas-filled lamps. Further, organic EL elements are also attracting attention as the leading self-luminous display for replacing liquid crystal displays (LCD) in the field of flat panel displays (FPD), and commercial products are becoming increasingly available.

Depending on the organic materials used, organic EL elements are broadly classified into two types: low-molecular weight type organic EL elements and polymer type organic EL elements. In polymer type organic EL elements, a polymer material is used as the organic material, whereas in low molecular weight type organic EL elements, a low-molecular weight material is used.

Compared with low-molecular weight type organic EL elements in which film formation is mainly performed in vacuum systems, polymer type organic EL elements enable simple film formation to be conducted by wet processes such as inkjet printing, and are therefore expected to be indispensable elements in future large-screen organic EL displays. Accordingly, much development is being undertaken into materials that are suitable for wet processes (for example, see Patent Document 1).

CITATION LIST

Patent Literature

Patent Document 1: WO 2010/140553

SUMMARY OF INVENTION

Technical Problem

Generally, an organic EL element produced by wet processes using a polymer material has the advantages of facilitating cost reductions and increases in the element surface area. However, conventional polymer materials require further improvements in wet process characteristics such as solubility in solvents and curability.

The present invention has been developed in light of the above circumstances, and provides a charge transport polymer, a charge transport material and an ink composition that are suitable for wet processes. Further, the present invention also provides an organic layer that exhibits excellent solvent resistance, and an organic electronic element, an organic EL element, a display element, an illumination device and a display device that include the above organic layer.

Solution to Problem

Example of embodiments of the invention are described below. However, the present invention is not limited to the following embodiments.

One embodiment relates to a charge transport polymer containing a molecular chain and terminal groups bonded to the molecular chain, wherein the terminal groups include a terminal group P containing a polymerizable functional group and a terminal group EW containing an aromatic hydrocarbon group substituted with an electron-withdrawing substituent, the terminal group P includes a terminal group represented by formula (P1) shown below, and among the carbon atoms contained in the ring of the aromatic hydrocarbon group, if the carbon atom that is bonded to the molecular chain is numbered 1, and numbers are assigned in order to the adjoining carbon atoms, then the electron-withdrawing substituent is bonded to a carbon atom numbered 1+2n (wherein n is an integer of 1 or greater).

[Chemical formula 1]

$$*-(\!\!-Ar\!\!-\!\!)_a-[(\!\!-L\!\!-\!\!)_x-PG]_y \quad (P1)$$

[In the formula, Ar represents a substituted or unsubstituted aromatic cyclic group, L represents a linking group, and PG represents a substituted or unsubstituted polymerizable functional group. Each of a and x independently represents 0 or 1, and y represents an integer of 1 or greater. However, the formula (P1) must not include a partial structure represented by $-Ar-CH_2-O-(CH_2)_n-O-$ (wherein n is an integer of 1 to 6).]

In one embodiment, the charge transport polymer described above contains from 3 to 60 mol % of structural units containing the terminal groups, based on the total of all the structural units of the charge transport polymer.

In one embodiment, in either of the charge transport polymers described above, the electron-withdrawing substituent contains at least one type of group selected from the group consisting of halogen groups, halogen-substituted alkyl groups, a nitro group, a cyano group, a sulfonate group and a sulfoxide group.

In one embodiment, any one of the charge transport polymers described above contains from 15 to 95 mol % of the terminal group EW, based on the total of all the terminal groups.

In one embodiment, in any one of the charge transport polymers described above, the polymerizable functional group contains at least one type of group selected from the group consisting of groups having a carbon-carbon multiple bond, groups having a small ring, and heterocyclic groups.

In one embodiment, any one of the charge transport polymers described above contains at least one type of structure selected from the group consisting of substituted or unsubstituted aromatic amine structures, substituted or unsubstituted carbazole structures, substituted or unsubstituted thiophene structures, substituted or unsubstituted bithiophene structures, substituted or unsubstituted benzene structures and substituted or unsubstituted fluorene structures.

In one embodiment, any one of the charge transport polymers described above has a structure that is branched in three or more directions.

Another embodiment relates to a charge transport material containing any one of the charge transport polymers described above.

Yet another embodiment relates to an ink composition containing any one of the charge transport polymers described above or the charge transport material described above, and a solvent.

Yet another embodiment relates to an organic layer formed using any one of the charge transport polymers described above, the charge transport material described above, or the ink composition described above.

Yet another embodiment relates to an organic electronic element having the organic layer described above.

Yet another embodiment relates to an organic electroluminescent element having the organic layer described above.

Further, other embodiments relate to a display element containing the organic electroluminescent element described above; an illumination device containing the organic electroluminescent element described above; and a display device containing the illumination device described above, and a liquid crystal element as a display unit.

Advantageous Effects of Invention

The present invention is able to provide a charge transport polymer, a charge transport material and an ink composition that are suitable for wet processes. Further, the present invention also provides an organic layer that exhibits excellent solvent resistance, and an organic electronic element, an organic EL element, a display element, an illumination device and a display device that include the above organic layer.

BRIEF DESCRIPTION OF DRAWINGS

FIG. 1 is a cross-sectional schematic view illustrating an evaluation device used in the examples.

DESCRIPTION OF EMBODIMENTS

Embodiments of the present invention are described below. However, the present invention is not limited to the following embodiments.

Charge Transport Polymer

According to one embodiment, a charge transport polymer contains a molecular chain and terminal groups bonded to the molecular chain, wherein the terminal groups include a terminal group P containing a polymerizable functional group and a terminal group EW containing an aromatic hydrocarbon group substituted with an electron-withdrawing substituent. The terminal group P includes a terminal group represented by formula (P1) shown below. Among the carbon atoms contained in the ring of the aromatic hydrocarbon group, if the carbon atom that is bonded to the molecular chain is numbered 1, and numbers are assigned in order to the adjoining carbon atoms, then the electron-withdrawing substituent is bonded to a carbon atom numbered 1+2n (wherein n is an integer of 1 or greater).

A charge transport polymer is a polymer that has the ability to transport an electric charge. In this description, the term "polymer" also includes polymers having a small number of structural units, so-called "oligomers".

By introducing the terminal group P and the terminal group EW into the charge transport polymer, the solubility of the charge transport polymer in solvents can be improved and superior curability can be obtained in wet processes.

Terminal Group P Containing a Polymerizable Functional Group

The charge transport polymer has the terminal group P containing a polymerizable functional group at a terminal of the molecular chain. The terminal group P may also contain one or more other arbitrary groups besides the polymerizable functional group. Examples of the terminal group P include "polymerizable functional groups" and "aromatic cyclic groups substituted with a group containing a polymerizable functional group" and the like. The terminal group P includes at least a terminal group represented by formula (P1) shown below.

Polymerizable Functional Group

A "polymerizable functional group" refers to a functional group which is able to form bonds upon the application of heat and/or light. As a result of including the polymerizable functional group, the charge transport polymer exhibits curability. By curing the coating film formed using the charge transport polymer and forming an organic layer (also referred to as a "cured film" in this description), the organic layer can be imparted with the solvent resistance necessary to enable the stacking of an upper layer by a wet process.

For example, in those cases where a charge transport polymer having a polymerizable functional group is used for forming a hole transport layer, the formed hole transport layer has solvent resistance. As a result, a light-emitting layer can be formed as an upper layer using an ink composition or the like, without dissolving the hole transport layer. Light-emitting layers are generally applied using an aromatic hydrocarbon-based solvent. Accordingly, the charge transport polymer is preferably a charge transport polymer capable of forming a charge transport layer that is resistant to dissolution even when immersed in an aromatic hydrocarbon-based solvent such as toluene.

In those cases where a wet process is used to apply an ink composition for an upper layer to the top of a coating film formed using a charge transport polymer that does not have a polymerizable functional group, components of the charge transport polymer can sometimes be eluted into the ink composition of the upper layer material. Depending on the degree of this elution of the charge transport polymer components, the elution can cause an increase in the drive voltage of the organic electronic element, or a deterioration in the emission efficiency or the lifespan of the element.

Examples of the polymerizable functional group include groups having a carbon-carbon multiple bond (such as a vinyl group, allyl group, butenyl group, ethynyl group, acryloyl group, acryloyloxy group, acryloylamino group, methacryloyl group, methacryloyloxy group, methacryloylamino group, vinyloxy group and vinylamino group), groups having a small ring (including cyclic alkyl groups such as a cyclopropyl group and cyclobutyl group; cyclic ether groups such as an epoxy group (oxiranyl group) and oxetane group (oxetanyl group); cyclic thioether groups such as an episulfide group; cyclic ester groups such as diketene groups and lactone groups; and cyclic amide groups such as lactam groups), and heterocyclic groups (such as a furanyl group, pyrrolyl group, thiophenyl group and silolyl group). The polymerizable functional group preferably contains at least one type of group selected from the group consisting of groups having a carbon-carbon multiple bond, groups having a small ring, and heterocyclic groups, and more preferably contains at least one type of group selected from the group consisting of groups having a carbon-carbon double bond, cyclic ether groups, and heterocyclic groups. Specifically, preferred polymerizable functional groups include a vinyl group, acryloyl group, methacryloyl group, epoxy group, oxetane group, pyrrolyl group and thiophenyl group, and from the viewpoints of the solubility and curability of the charge transport polymer, a vinyl group, oxetane group or thiophenyl group is more preferred. The polymerizable functional group may be a substituted or unsubstituted polymerizable functional group, and examples of substituents that may be included in the polymerizable functional group include alkyl groups of 1 to 6 carbon atoms such as a methyl group and an ethyl group. In one embodiment, the terminal group P is a "polymerizable functional group".

Aromatic Cyclic Group

In one embodiment, the terminal group P is an "aromatic cyclic group substituted with a group containing a polymerizable functional group".

From the viewpoints of increasing the degree of freedom associated with the polymerizable functional group and facilitating the polymerization reaction, the polymerizable functional group and the aromatic cyclic group are preferably linked via a linking group such as an alkylene chain (for example, of 1 to 10 carbon atoms). Further, in the case where, for example, the organic layer is to be formed on an electrode, from the viewpoint of enhancing the affinity with hydrophilic electrodes of ITO or the like, the polymerizable functional group and the aromatic cyclic group are preferably linked via a hydrophilic linking group such as an ethylene glycol chain or a diethylene glycol chain. Moreover, from the viewpoint of simplifying procurement or synthesis of the monomer used for introducing the polymerizable functional group into the charge transport polymer, the charge transport polymer may have one or more types of linking group selected from the group consisting of ether linkages and ester linkages between the polymerizable functional group and the aromatic cyclic group.

In this description, the "polymerizable functional group" itself, or the "group containing a combination of the polymerizable functional group and a linking group such as an alkylene chain or an ether linkage" may be referred to as a "group containing a polymerizable functional group". Examples of this group containing a polymerizable functional group include the groups exemplified in WO 2010/140553.

The "aromatic cyclic group" is preferably an aromatic cyclic group of 2 to 30 carbon atoms. Examples of the aromatic cyclic group include aromatic hydrocarbons and aromatic heterocycles. Further, examples of the aromatic cyclic group include single rings, condensed polycyclic aromatic hydrocarbons, and condensed polycyclic aromatic heterocycles. Examples of the aromatic hydrocarbons include benzene, naphthalene, anthracene, tetracene (naphthacene), fluorene, phenanthrene, 9,10-dihydrophenanthrene, triphenylene, pyrene, chrysene, perylene, triphenylene, pentacene, and benzopyrene. Examples of the aromatic heterocycles include pyridine, pyrazine, quinoline, isoquinoline, carbazole, acridine, phenanthroline, furan, pyrrole, thiophene, oxazole, oxadiazole, thiadiazole, triazole, benzoxazole, benzoxadiazole, benzothiadiazole, benzotriazole, and benzothiophene. The aromatic ring may also have a structure in which two or more independent structures selected from among single rings and condensed rings are bonded together. Examples of such structures include biphenyl, terphenyl, triphenylbenzene, and bithiophene. The aromatic cyclic group may have a substituent, and examples of the substituent include the groups described below for R in structural unit L (but excluding groups containing a polymerizable functional group).

From the viewpoint of the ease of commercial procurement or the ease of synthesis of the monomer used for introducing the terminal group P, the aromatic ring is preferably an aromatic hydrocarbon, and is more preferably a benzene ring.

Terminal Group Represented by Formula (P1)

The terminal group P includes at least a terminal group represented by formula (P1) shown below. The terminal group represented by formula (P1) is a preferred group from the viewpoint of obtaining favorable heat resistance.

[Chemical formula 2]

(P1)

In the formula, Ar represents a substituted or unsubstituted aromatic cyclic group, L represents a linking group, and PG represents a substituted or unsubstituted polymerizable functional group. Each of a and x independently represents 0 or 1, and y represents an integer of 1 or greater. However, the formula (P1) must not include a partial structure represented by —Ar—CH$_2$—O—(CH$_2$)$_n$—O— (wherein n is an integer of 1 to 6). In this description, the reference sign "*" denotes a bonding site with another structure.

The upper limit for y is determined by the structure of Ar. For example, if Ar represents a benzene ring, then y is not more than 5, and is preferably 2 or less.

The terminal group represented by formula (P1) does not include a structure represented by —Ar—CH$_2$—O—(CH$_2$)$_n$—O— (wherein n is an integer of 1 to 6). If the terminal group represented by formula (P1) includes a structure represented by —Ar—CH$_2$—O—(CH$_2$)$_n$—O—, then the —CH$_2$—O— within this structure tends to be prone to bond cleavage of the —CH$_2$—O— under heat. From the viewpoint of heat resistance, the terminal group represented by formula (P1) preferably does not include a structure represented by —Ar—CH$_2$—O—. It is thought that a terminal group represented by formula (P1) contributes to an improvement in the heat resistance of the organic layer.

Furthermore, in one embodiment, examples of the terminal group represented by formula (P1) include terminal groups represented by formula (P2) shown below. The terminal groups represented by formula (P2) represent groups that are preferred from the viewpoint of obtaining superior heat resistance.

[Chemical formula 3]

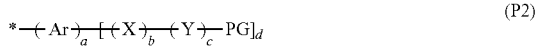

(P2)

In the formula, Ar represents a substituted or unsubstituted aromatic cyclic group of 2 to 30 carbon atoms, X represents a divalent group represented by any one of formulas (X1) to (X10) shown below, Y represents an alkylene group of 1 to 10 carbon atoms, and PG represents a substituted or unsubstituted polymerizable functional group. Each of a to c independently represents 0 or 1, and d represents 1 or 2. However, when d is 2, a is 1.

[Chemical formula 4]

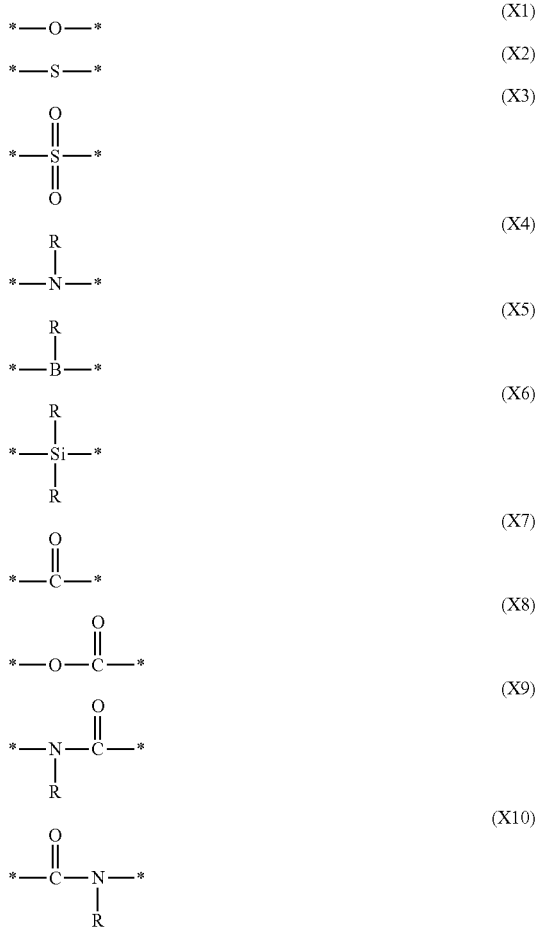

In the formulas, each R independently represents a hydrogen atom, a linear, cyclic or branched alkyl group of 1 to 22 carbon atoms, or an aryl group or heteroaryl group of 2 to 30 carbon atoms.

From the viewpoint of obtaining favorable heat resistance, when b is 1, X is preferably a group represented by formula (X1).

In one embodiment, the terminal group P preferably includes a group of formula (P2) that satisfies the following conditions: Ar is an aromatic hydrocarbon group, X is a group represented by formula (X1), Y is an alkylene group of 1 to 6 carbon atoms, PG is a group having a substituted or unsubstituted small ring, and a to d each represent 1. Ar is preferably a benzene ring. PG is preferably a substituted or unsubstituted cyclic ether group, more preferably a substituted or unsubstituted oxetane group or a substituted or unsubstituted epoxy group, and even more preferably a substituted or unsubstituted oxetane group. In this embodiment, better solubility tends to be obtainable.

In one embodiment, the terminal group P preferably includes a group of formula (P2) that satisfies the following conditions: Ar is an aromatic hydrocarbon group, PG is a substituted or unsubstituted group having a carbon-carbon multiple bond, a and d each represent 1, and b and c each represent 0. Ar is preferably a benzene ring. PG is preferably a substituted or unsubstituted group having a carbon-carbon double bond, and is more preferably a substituted or unsubstituted vinyl group.

In one embodiment, the terminal group P preferably includes a group of formula (P2) that satisfies the following conditions: PG is a substituted or unsubstituted heterocyclic group, a to c each represent 0, and d represents 1. PG is preferably a substituted or unsubstituted pyrrolyl group or a substituted or unsubstituted thiophenyl group, and is more preferably a substituted or unsubstituted thiophenyl group.

The terminal group P differs from the terminal group EW, and by having both these groups at the terminals, the charge transport polymer is able to exhibit improved solubility in solvents and excellent curability. From the viewpoints of imparting the charge transport polymer with excellent curability and obtaining an organic layer having superior solvent resistance, the proportion of the terminal group P, based on the total of all terminal groups contained in the charge transport polymer, is preferably at least 5 mol %, more preferably at least 10 mol %, and even more preferably 20 mol % or greater. If the organic layer has superior solvent resistance, then elution of components of the charge transport polymer into the ink composition used when forming an upper layer can be prevented. On the other hand, from the viewpoint of improving the solubility, and from the viewpoint of improving the heat resistance, the proportion of the terminal group P, based on the total of all terminal groups contained in the charge transport polymer, is preferably not more than 85 mol %, more preferably not more than 80 mol %, and even more preferably 75 mol % or less. The above range is preferred from the viewpoint of preventing linking groups formed by bonding between polymerizable functional groups from impeding the charge transport properties. If the charge transport properties are impeded, then this tends to cause an increase in the drive voltage of the organic electronic element.

Examples of methods that may be used for confirming the curability of the charge transport polymer and the solvent resistance of the organic layer include: (1) a residual film ratio test, and (2) an elution amount test. The residual film ratio test (1) is a method in which an organic layer composed of a cured film formed using the charge transport polymer is immersed in a solvent, and the degree of curability and solvent resistance are confirmed from the reduction in the film thickness. The elution amount test (2) is a method in which an organic layer composed of a cured film formed using the charge transport polymer is immersed in a solvent, and the degree of curability and solvent resistance are confirmed from the amount of charge transport polymer components eluted into the solvent. In the residual film ratio test (1), the residual film ratio can be determined from the ratio between the measured values for the thickness of the organic layer, or from the ratio between the measured values for the absorbance of the organic layer. Details regarding the residual film ratio test (1) are described below.

The residual film ratio is preferably at least 50%, more preferably at least 80%, even more preferably at least 90%, and particularly preferably 95% or greater.

In the production of an organic electronic element, there are no particular limitations on the solvent used in the wet processes, but examples of solvents that are generally widely used include aromatic hydrocarbon-based solvents such as toluene, aromatic ether-based solvents such as anisole, and aromatic ester-based solvents such as butyl benzoate. The organic layer preferably exhibits favorable solvent resistance at least relative to toluene. It is more preferable that the organic layer has solvent resistance relative to toluene and anisole, or toluene and butyl benzoate. Accordingly, it is preferable that at least toluene is used as a solvent in the residual film ratio test (1) and the elution amount test (2).

Furthermore, from the viewpoint of obtaining superior heat resistance, the proportion of the terminal group P represented by formula (P1), based on all of the terminal groups P, is preferably at least 50 mol %, more preferably at least 70 mol %, and even more preferably 90% or greater. There are no particular limitations on the upper limit, and a proportion of 100% is particularly desirable.

Terminal Group EW Containing an Aromatic Hydrocarbon Group Substituted with an Electron-Withdrawing Substituent The charge transport polymer has the terminal group EW containing an aromatic hydrocarbon group substituted with an electron-withdrawing substituent at a terminal of the molecular chain Among the carbon atoms contained in the ring of the aromatic hydrocarbon group, if the carbon atom that is bonded to the molecular chain is numbered 1, and numbers are assigned in order to the adjoining carbon atoms, then the electron-withdrawing substituent is bonded to a carbon atom numbered 1+2n (wherein n is an integer of 1 or greater).

Electron-Withdrawing Substituent

An "electron-withdrawing substituent" is a substituent which, compared with a hydrogen atom, withdraws electrons more readily from atoms bonded to the substituent. By including, at a terminal of the molecular chain, an aromatic hydrocarbon group in which a hydrogen atom bonded to a specific carbon atom has been substituted with an electron-withdrawing substituent, the charge transport polymer is able to exhibit excellent solubility in solvents. It is surmised that the existence of the electron-withdrawing substituent bonded to the specific carbon atom improves the solubility of the charge transport polymer.

In a wet process, the charge transport polymer is dissolved in a solvent to produce an ink composition. For example, in those cases where the charge transport polymer does not contain the terminal group EW, the solubility of the charge transport polymer decreases, which can sometimes cause a lengthening of the time required to dissolve the polymer in the solvent, a reduction in the soluble concentration, or even insolubilization in some cases. As a result, in the wet process, additional processes such as heating must be added during production of the ink composition, and operational times tend to increase, causing a deterioration in productivity.

Examples of the electron-withdrawing substituent include halogen groups, halogen-substituted alkyl groups, a nitro group, a cyano group, a sulfonate group and a sulfoxide group. However, the electron-withdrawing substituent is not limited to these groups. Examples of the halogen groups include a fluoro group, chloro group, bromo group and iodo group. The number of carbon atoms in the alkyl groups is preferably from 1 to 6, more preferably from 1 to 3, and even more preferably 1. From the viewpoint of the electron-withdrawing strength, the halogen group is preferably a fluoro group, and the halogen-substituted alkyl groups are preferably fluoroalkyl groups. If the thermal stability of the charge transport polymer is taken into consideration, then the electron-withdrawing substituent is preferably a fluoro group, a fluoroalkyl group, a sulfonate group, or a sulfoxide group, is more preferably a fluoro group or a fluoroalkyl group, and is even more preferably a fluoroalkyl group. In those cases where the terminal group EW contains a plurality of electron-withdrawing substituents, this plurality of electron-withdrawing substituents may be the same or different.

Aromatic Hydrocarbon Group

The "aromatic hydrocarbon group" is preferably an aromatic hydrocarbon group of 6 to 30 carbon atoms. Examples of the aromatic hydrocarbon are as described above. In those cases where the aromatic hydrocarbon is a condensed polycyclic aromatic hydrocarbon, all of the rings that form the aromatic hydrocarbon are preferably benzene rings.

The number of carbon atoms in the aromatic hydrocarbon group is preferably 6 or greater. From the viewpoint of the ease of commercial procurement or the ease of synthesis of the monomer used for introducing the terminal group EW, the number of carbon atoms in the aromatic hydrocarbon group is preferably not more than 18, and from the viewpoint of the solubility, is preferably not more than 12, and more preferably 10 or fewer. The lower the number of carbon atoms in the aromatic hydrocarbon group, the more the solubility tends to improve.

In the terminal group EW, the electron-withdrawing substituent is bonded to the aromatic hydrocarbon group, and in the charge transport polymer, the aromatic hydrocarbon group is bonded to the molecular chain. There are no particular limitations on the bonding position between the aromatic hydrocarbon group and the molecular chain.

Examples of the aromatic hydrocarbon group are shown below. In this description, a wavy line in a formula indicates a bonding site with another structure.

[Chemical formula 5]

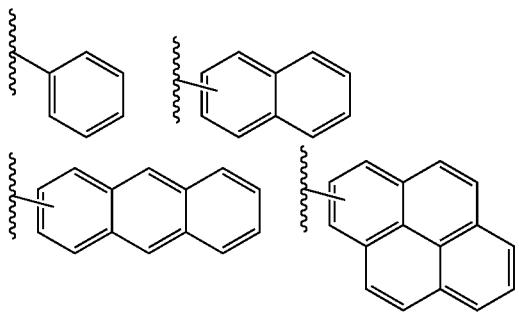

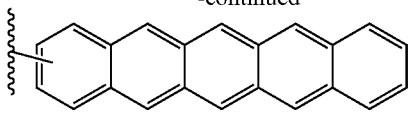

Among the carbon atoms contained in the ring(s) of the aromatic hydrocarbon group, if the carbon atom that is bonded to the molecular chain is numbered 1, and numbers are assigned in order to the adjoining carbon atoms, then the electron-withdrawing substituent is bonded to a carbon atom numbered 1+2n (wherein n is an integer of 1 or greater). The upper limit for n is determined by the number of carbon atoms contained in the ring(s) of the aromatic hydrocarbon group. In this description, the numbers assigned to carbon atoms are also referred to as "substitution position numbers". The assigning of substitution position numbers follows the following procedure.

(1) Among the carbon atoms contained in the ring(s) of the aromatic hydrocarbon group, the substitution position number of the carbon atom that is bonded to the molecular chain is numbered 1 (the starting point).

(2) Using the carbon atom at the substitution position number 1 as the starting point, numbers are assigned in order to each of the adjoining carbon atoms in a single direction around the outer periphery of the aromatic hydrocarbon group.

Examples of the aromatic hydrocarbon group with substitution position numbers assigned to the carbon atoms are shown below.

[Chemical formula 6]

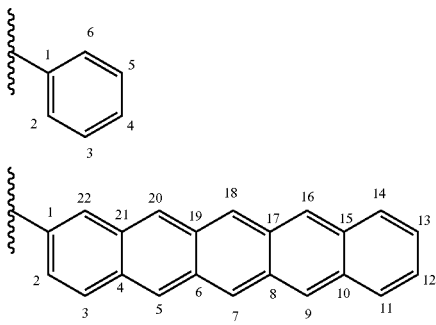

In the terminal group EW, at least one electron-withdrawing substituent is bonded to a carbon atom having a substitution position number of 1+2n. The position of the substitution position number 1+2n corresponds with a position that cannot be depicted as a localized electron structure when the resonance structures of the terminal group EW are drawn. The resonance structures of the terminal group EW are depicted as states in which the aromatic hydrocarbon group is bonded to a molecular chain that can donate an electron to the aromatic hydrocarbon group. For example, in a state where the end structure of the molecular chain is an aromatic ring (for example, a benzene ring), and the aromatic hydrocarbon group is bonded to this aromatic ring, resonance structures are drawn for the terminal group EW. Examples of the resonance structures are shown below. In the formula, EWG indicates the electron-withdrawing substituent (electron-withdrawing group).

Substitution Position Number 2n: The Case where a Localized Structure can be Depicted When depicting the resonance structures of the terminal group EW, when the substitution position number of the carbon atom that is bonded to the molecular chain is numbered 1, a localized structure can be drawn for those positions having a substitution position number of 2n (wherein n is an integer of 1 or greater) (namely, wherein 2n is an even number). An example of a structure having the electron-withdrawing substituent bonded to the carbon atom having a substitution position number of 2n (n=2) is shown below.

[Chemical formula 7]

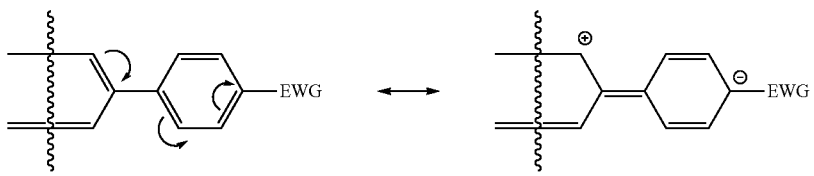

Substitution Position Number 1+2n: The Case where a Localized Structure Cannot be Depicted When depicting the resonance structures of the terminal group EW, when the substitution position number of the carbon atom that is bonded to the molecular chain is numbered 1, a localized structure cannot be drawn for those positions having a substitution position number of 1+2n (wherein n is an integer of 1 or greater) (namely, wherein 1+2n is an odd number). An example of a structure having the electron-withdrawing substituent bonded to the carbon atom having a substitution position number of 1+2n (n=1), and an example of a structure having electron-withdrawing substituents bonded to the carbon atom having a substitution position number of 1+2n (n=1) and the carbon atom having a substitution position number of 1+2n (n=2) are shown below.

[Chemical formula 8]

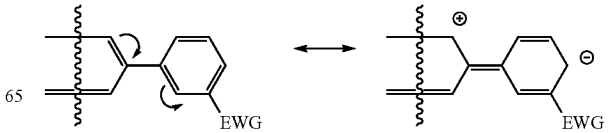

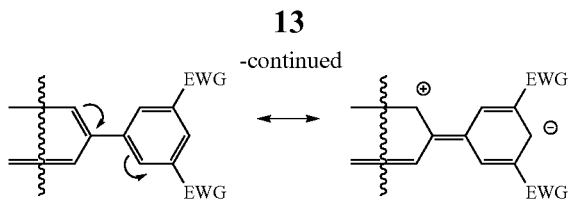

In the terminal group EW, there are no restrictions on the existence or absence of substituents on carbon atoms within the aromatic hydrocarbon group having a substitution position number of 2n (wherein n is an integer of 1 or greater). In one embodiment, if consideration is also given to effects on the solubility, then the carbon atoms within the aromatic hydrocarbon group having a substitution position number of 2n (wherein n is an integer of 1 or greater) have no substituents.

Structural Examples of Terminal Group EW

The terminal group EW has a structure in which the carbon atom at a substitution position number 1+2n (wherein n is an integer of 1 or greater) of the aromatic hydrocarbon group has an electron-withdrawing substituent. Specific examples of the terminal group EW include groups represented by formulas (EW1) to (EW5) shown below. However, the terminal group EW is not limited to these structures, and there are no limitations on the bonding position of each electron-withdrawing substituent or the number of electron-withdrawing substituents, provided that the structure includes an aromatic hydrocarbon group that has been substituted with an electron-withdrawing substituent, and has the electron-withdrawing substituent bonded to a carbon atom within the aromatic hydrocarbon group having a substitution position number of 1+2n (wherein n is an integer of 1 or greater). If consideration is also given to improving the solubility, then the number of electron-withdrawing substituents is preferably 2 or greater. Further, if consideration is given to improving the solubility, then a group represented by one of the formulas (EW1) to (EW5) is preferred, a group represented by formula (EW1) or formula (EW2) is more preferred, and a group represented by formula (EW2) is even more preferred.

[Chemical formula 9]

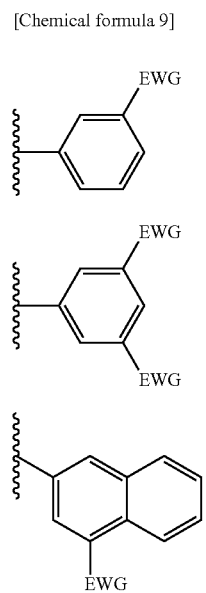

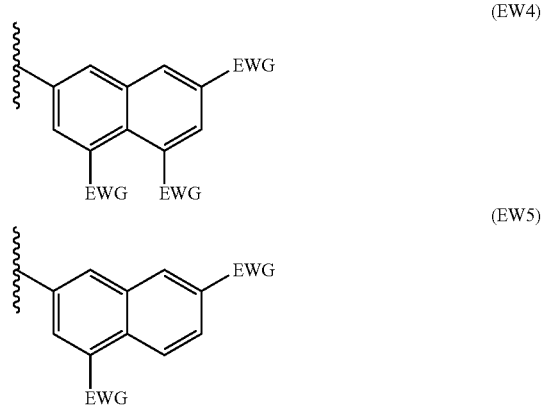

In the above formulas, EWG represents an electron-withdrawing substituent.

Specific examples of EWG include the substituents shown below. R represents an alkyl group, wherein the number of carbon atoms in the alkyl group is, for example, from 1 to 6. However, EWG is not limited to these substituents. EWG is preferably —X or —$CX_3$. X is preferably —F.

[Chemical formula 10]

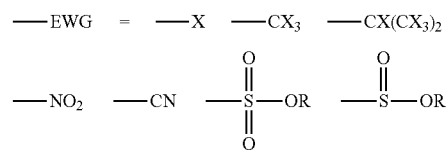

More specific examples of the terminal group EW are shown below. However, the terminal group EW is not limited to these groups.

[Chemical formula 11]

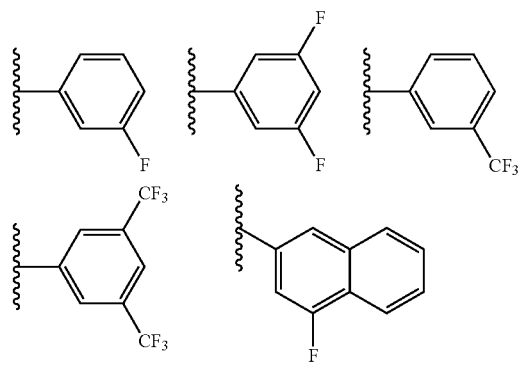

From the viewpoint of imparting the charge transport polymer with superior solubility, the proportion of the terminal group EW, based on the total of all the terminal groups contained in the charge transport polymer, is preferably at least 15 mol %, more preferably at least 20 mol %, and even more preferably 25 mol % or greater. Moreover, in those cases where it is desirable to expand the selectable range of solvents, this proportion is preferably at least 40 mol %, more preferably at least 75 mol %, and eve more preferably 85 mol % or greater. By imparting the charge transport polymer with excellent solubility, a satisfactory margin can be ensured for the preparation conditions for ink compositions. On the other hand, from the viewpoint of imparting the charge transport polymer with satisfactory curability, the proportion of the terminal group EW, based on the total number of moles of all the molecular chain terminal groups contained in the charge transport polymer, is preferably not more than 95 mol %, more preferably not more than 90 mol %, and even more preferably 80 mol % or less.

Examples of methods that may be used for confirming the solubility of the charge transport polymer include: (1) a dissolution time test, and (2) a soluble concentration test. The dissolution time test (1) is a method in which the charge transport polymer is dissolved in a solvent, and the time required for dissolution is evaluated. The soluble concentration test (2) is a method in which the concentration at which the charge transport polymer can be dissolved in a solvent is evaluated. Details regarding the dissolution time test (1) and the soluble concentration test (2) are described below. The charge transport polymer preferably has favorable solubility at least in toluene. It is more preferable that the charge transport polymer has favorable solubility in toluene and anisole, or in toluene and butyl benzoate, and even more preferable that the charge transport polymer has favorable solubility in toluene, anisole and butyl benzoate. Accordingly, it is preferable that at least toluene is used as the solvent in the dissolution time test (1) and the soluble concentration test (2). A combination of toluene with anisole and/or butyl benzoate may also be used.

Structure of Charge Transport Polymer

The charge transport polymer may be linear, or may be branched and have a branched structure. The charge transport polymer preferably contains at least a divalent structural unit L having charge transport properties and a monovalent structural unit T, and may also contain a trivalent or higher structural unit B that forms a branched portion. Further, another aspect of the charge transport polymer preferably has charge transport properties, contains at least a trivalent or higher structural unit B that forms a branched portion and a monovalent structural unit T, and may also contain a divalent structural unit. The molecular chain has a chain-like structure containing a divalent structural unit and/or a trivalent structural unit. Branch-like charge transport polymers exhibit excellent heat resistance, and because large numbers of terminal groups can be introduced, branch-like charge transport polymers also exhibit favorable solubility and curability. The charge transport polymer may contain only one type of each of these structural units, or may contain a plurality of types of each structural unit. In the charge transport polymer, the various structural units are bonded together at "monovalent" to "trivalent or higher" bonding sites.

Examples of the partial structures contained in the charge transport polymer include those shown below. However, the charge transport polymer is not limited to polymers having the following partial structures. In the partial structures, "L" represents a structural unit L, "T" represents a structural unit T, and "B" represents a structural unit B. In the following description, the reference sign "a" denotes a bonding site with another structural unit. In the following partial structures, the plurality of L structural units may be structural units having the same structure or structural units having mutually different structures. This also applies for the T and B units.

Linear Charge Transport Polymers

T-L-L-L-L-* [Chemical formula 12]

Branched Charge Transport Polymers

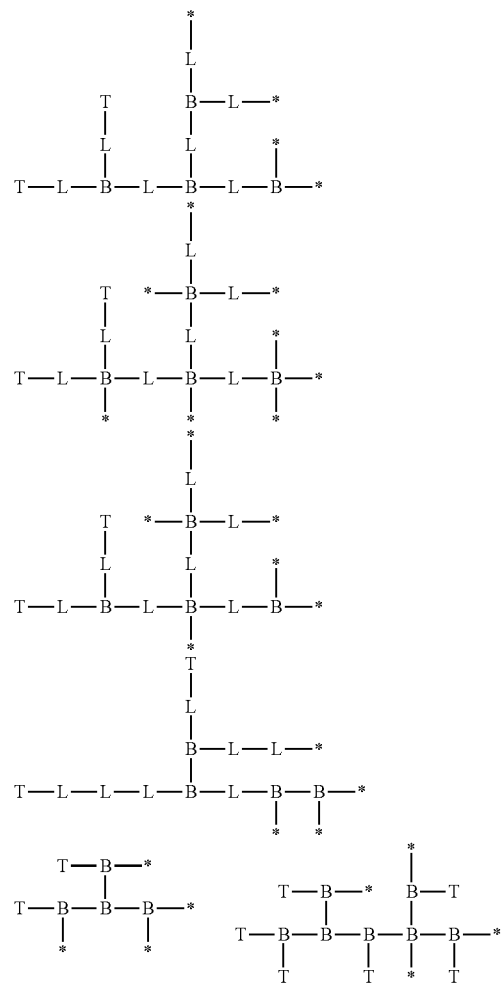

[Chemical formula 13]

In one embodiment, the charge transport polymer preferably has a divalent structural unit having charge transport properties. Further, in another embodiment, the charge transport polymer preferably has a structure branched in three or more directions, namely a structural unit B.

The charge transport polymer preferably contains at least one structure selected from the group consisting of aromatic amine structures, carbazole structures, thiophene structures, bithiophene structures, benzene structures and fluorene structures. These structures are preferably included in the structural unit L or the structural unit B. Further, these structures may be included in both the structural unit L and the structural unit B. By including at least one of these structures, the charge transport properties, and particularly the hole transport properties, can be improved.

Structural Unit L

The structural unit L is a divalent structural unit having charge transport properties. There are no particular limitations on the structural unit L, provided it includes an atom grouping having the ability to transport an electric charge. For example, the structural unit L may be selected from among aromatic amine structures, carbazole structures, thiophene structures, bithiophene structures, fluorene structures, benzene structures, biphenylene structures, terphenylene structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, benzotriazole structures, and N-arylphenoxazine structures, which may be substituted or unsubstituted structures, and structures containing one type, or two or more types, of the above structures. The aromatic amine structures are preferably triarylamine structures, and more preferably triphenylamine structures.

In one embodiment, from the viewpoint of obtaining superior hole transport properties, the structural unit L preferably contains at least one type of structure selected from the group consisting of substituted or unsubstituted aromatic amine structures, substituted or unsubstituted carbazole structures, substituted or unsubstituted thiophene structures, substituted or unsubstituted bithiophene structures, substituted or unsubstituted benzene structures, substituted or unsubstituted fluorene structures and substituted or unsubstituted pyrrole structures, more preferably contains at least one type of structure selected from the group consisting of substituted or unsubstituted aromatic amine structures, substituted or unsubstituted carbazole structures, substituted or unsubstituted thiophene structures, substituted or unsubstituted bithiophene structures, substituted or unsubstituted benzene structures and substituted or unsubstituted fluorene structures, and even more preferably contains at least one type of structure selected from the group consisting of substituted or unsubstituted aromatic amine structures and substituted or unsubstituted carbazole structures. In another embodiment, from the viewpoint of obtaining superior electron transport properties, the structural unit L preferably contains at least one type of structure selected from the group consisting of substituted or unsubstituted fluorene structures, substituted or unsubstituted benzene structures, substituted or unsubstituted phenanthrene structures, substituted or unsubstituted pyridine structures and substituted or unsubstituted quinoline structures.

Specific examples of the structural unit L are shown below. However, the structural unit L is not limited to the following structures.

[Chemical formula 14]

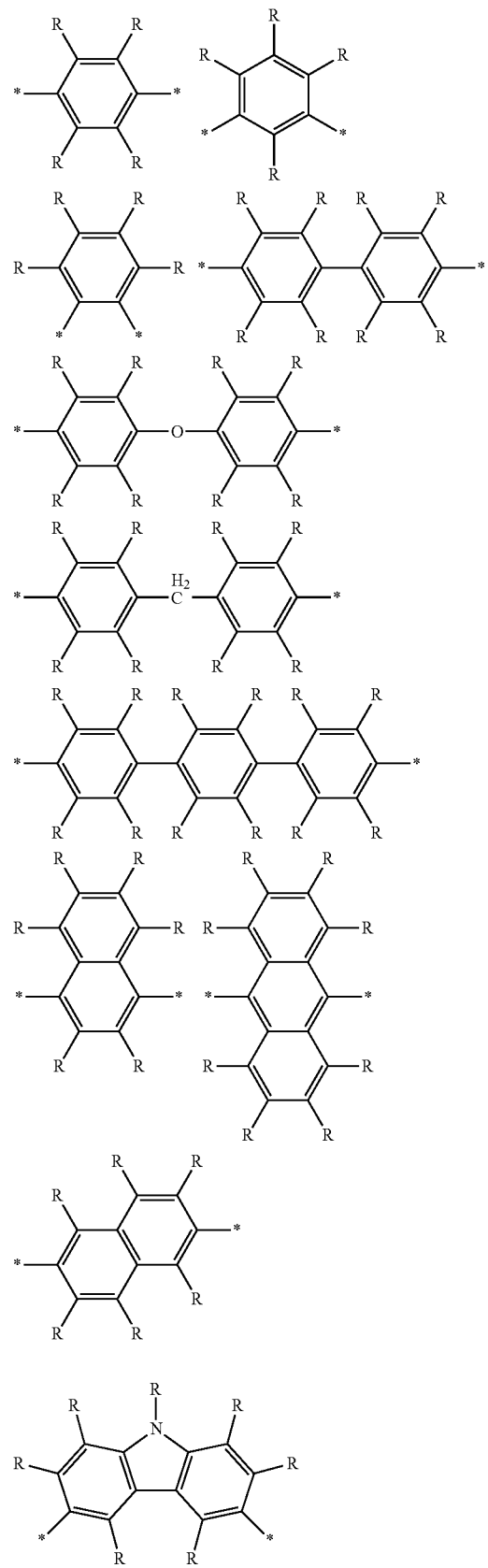

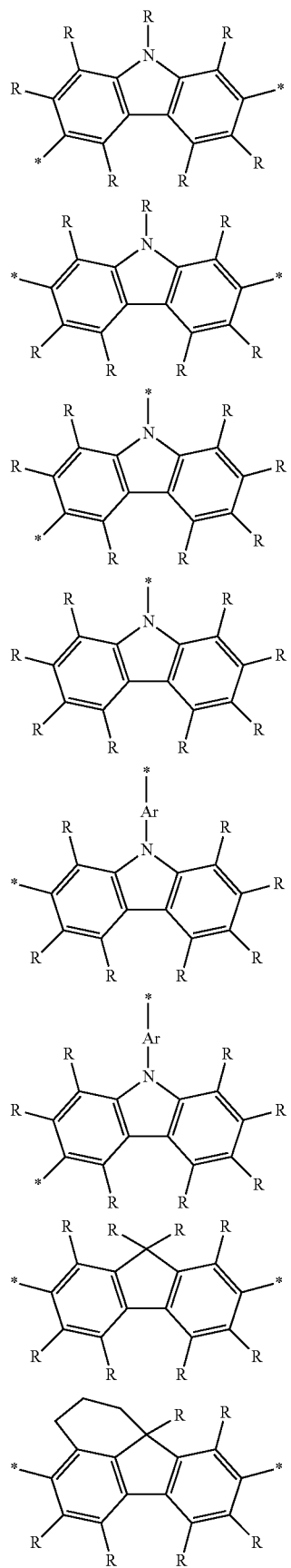
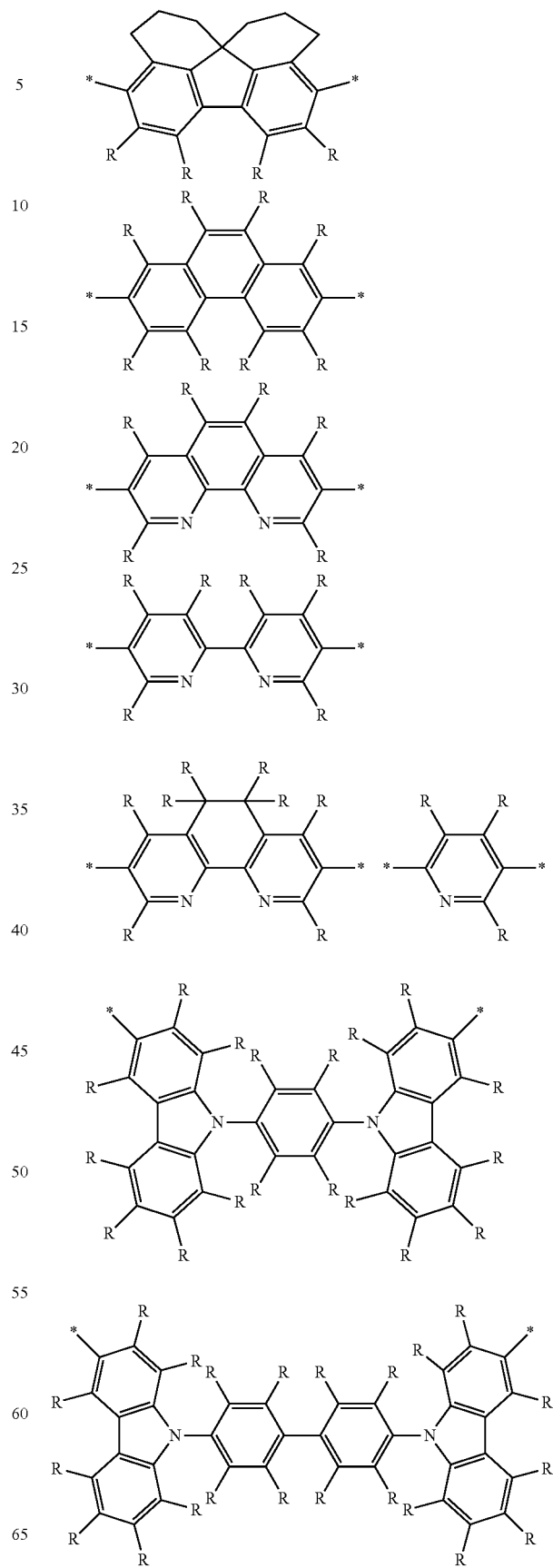

[Chemical formula 15]
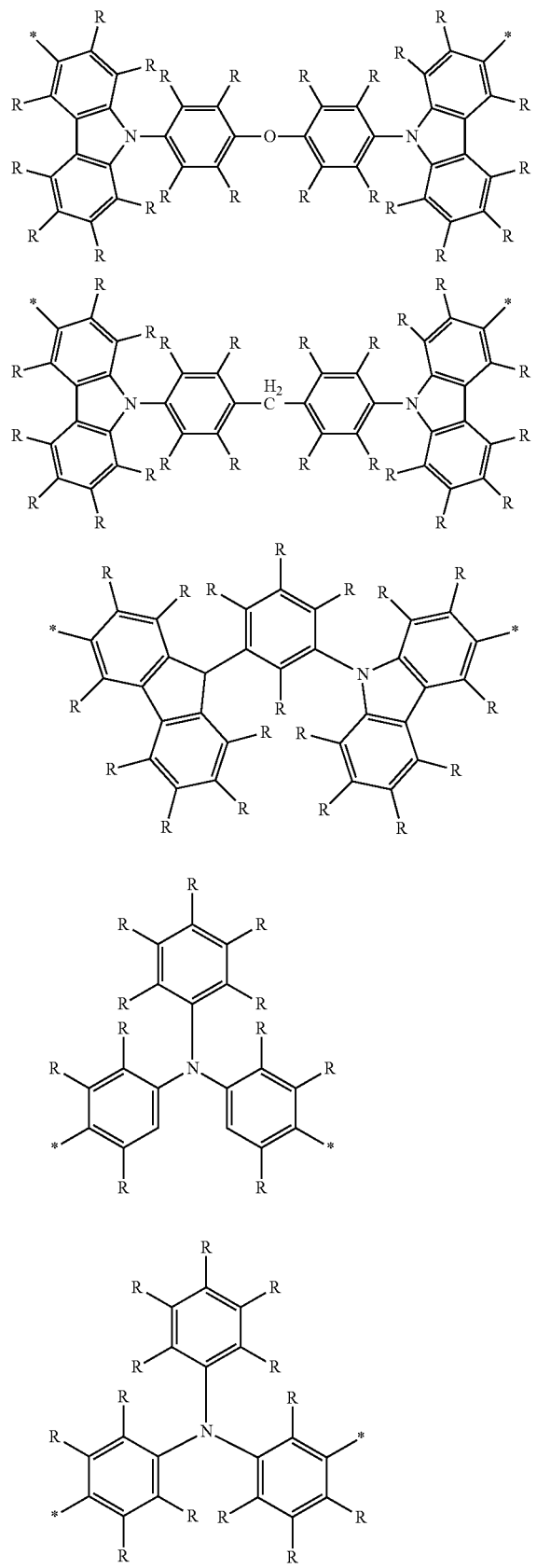
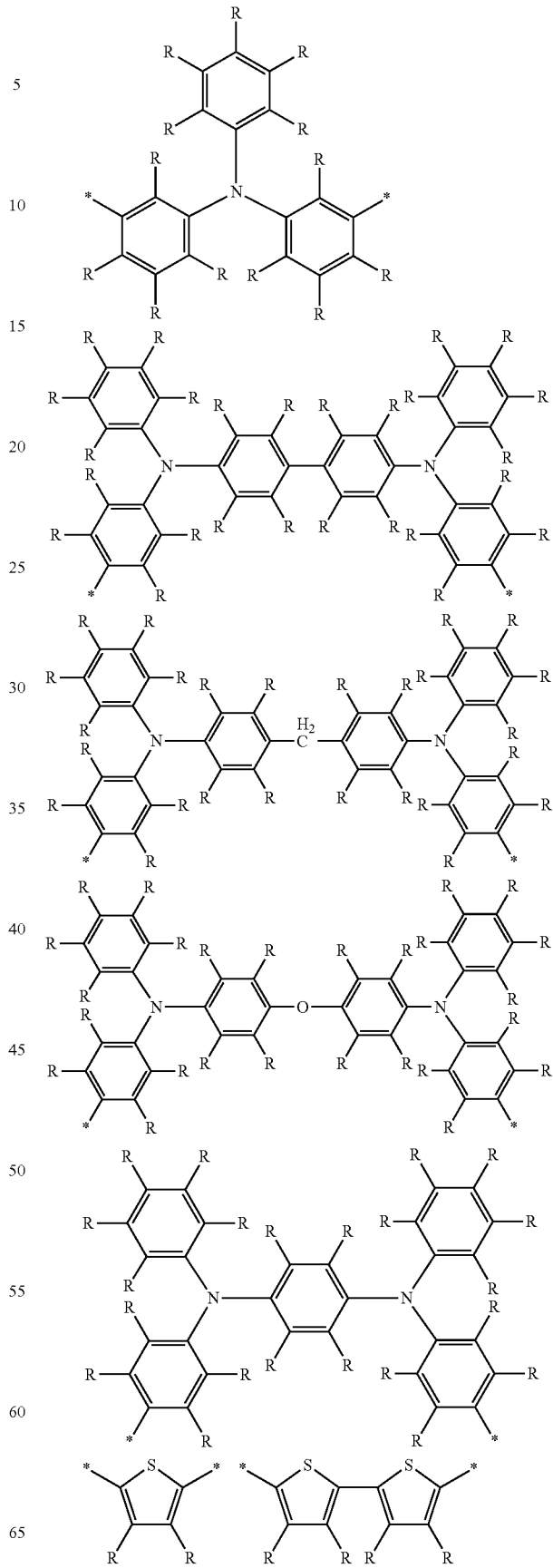

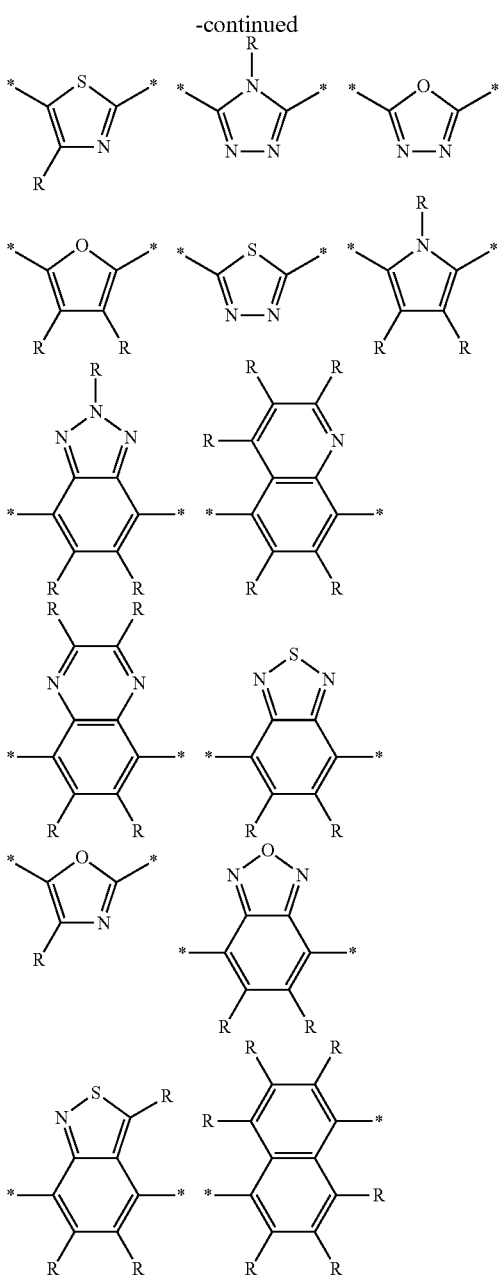

Each R independently represents a hydrogen atom or a substituent. It is preferable that each R is independently selected from a group consisting of —$R^1$, —$OR^2$, —$SR^3$, —$OCOR^4$, —$COOR^5$, —$SiR^6R^7R^8$, halogen atoms, and the aforementioned groups containing a polymerizable functional group. Each of $R^1$ to $R^8$ independently represents a hydrogen atom; a linear, cyclic or branched alkyl group of 1 to 22 carbon atoms; or an aryl group or heteroaryl group of 2 to 30 carbon atoms. An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an aryl group or heteroaryl group of 2 to 20 carbon atoms, and the aryl group or heteroaryl group may be further substituted with a linear, cyclic or branched alkyl group of 1 to 22 carbon atoms. There are no particular limitations on R in order for the charge transport polymer to display favorable solubility and curability as a result of having the specified terminal groups, and R may be selected in accordance with the functions required of the charge transport polymer. For example, when R is a halogen atom, the charge transport polymer exhibits superior solubility. R is preferably a hydrogen atom, a halogen atom, an alkyl group, an aryl group, or an alkyl-substituted aryl group, and from the viewpoint of improving the solubility, is more preferably an alkyl group. Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

Examples of the aromatic hydrocarbon include monocyclic rings, condensed rings, and polycyclic rings in which two or more rings selected from among monocyclic rings and condensed rings are bonded together via one or more single bonds. Examples of the aromatic heterocycles include monocyclic rings, condensed rings, and polycyclic rings in which two or more rings selected from among monocyclic rings and condensed rings are bonded together via one or more single bonds.

Structural Unit B

The structural unit B is a trivalent or higher structural unit that forms a branched portion in those cases where the charge transport polymer has a branched structure. From the viewpoint of improving the durability of the organic electronic element, the structural unit B is preferably not higher than hexavalent, and is more preferably either trivalent or tetravalent. The structural unit B is preferably a unit that has charge transport properties. For example, from the viewpoint of improving the durability of the organic electronic element, the structural unit B is preferably selected from among substituted or unsubstituted aromatic amine structures, substituted or unsubstituted carbazole structures, substituted or unsubstituted condensed polycyclic aromatic hydrocarbon structures, and structures containing one type, or two or more types, of these structures.

Specific examples of the structural unit B are shown below. However, the structural unit B is not limited to the following structures.

[Chemical formula 16]

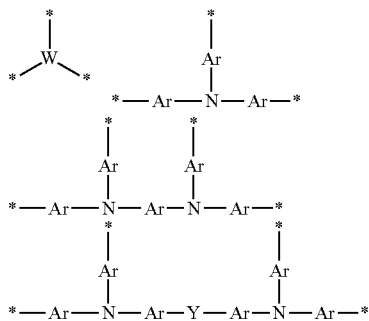

-continued

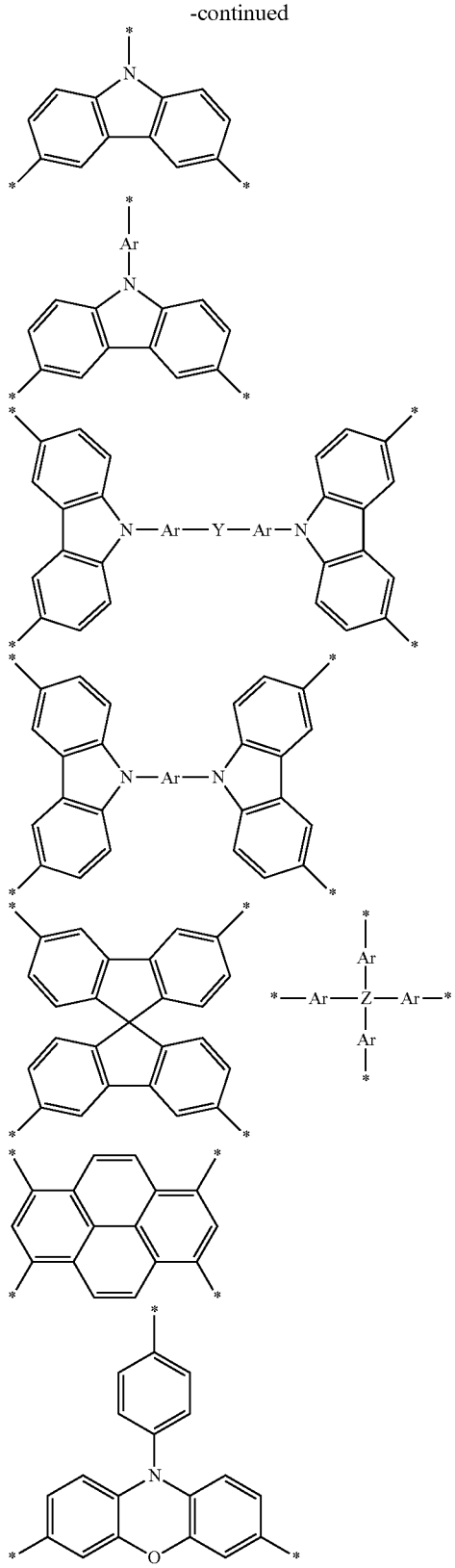

W represents a trivalent linking group, and for example, represents an arenetriyl group or heteroarenetriyl group of 2 to 30 carbon atoms. An arenetriyl group is an atom grouping in which three hydrogen atoms have been removed from an aromatic hydrocarbon. A heteroarenetriyl group is an atom grouping in which three hydrogen atoms have been removed from an aromatic heterocycle. Each Ar independently represents a divalent linking group, and for example, may represent an arylene group or heteroarylene group of 2 to 30 carbon atoms. Ar is preferably an arylene group, and more preferably a phenylene group. Y represents a divalent linking group, and examples include divalent groups in which an additional hydrogen atom has been removed from any of the R groups having one or more hydrogen atoms (but excluding groups containing a polymerizable functional group) described in relation to the structural unit L. Z represents a carbon atom, a silicon atom or a phosphorus atom. In the above structural units, the benzene rings and Ar groups may have substituents, and examples of the substituents include the R groups in the structural unit L.

Structural Unit T

The structural unit T is a monovalent structural unit that forms a terminal portion of the charge transport polymer, and is a structural unit containing a terminal group. The structural unit T includes at least a structural unit TP containing the terminal group P, and a structural unit TEW containing the terminal group EW. The structural unit T may also include an arbitrary structural unit TO that differs from both the structural unit TP and the structural unit TEW. The structural unit TO contains neither the terminal group P nor the terminal group EW.

The structural unit TP is a structural unit containing the terminal group P. The terminal group P described above may be the structural unit TP, and examples of the structural unit TP include groups represented by formula (P1).

The structural unit TEW is a structural unit containing the terminal group EW. The terminal group EW described above may be the structural unit TEW, and examples of the structural unit TEW include groups represented by formulas (EW1) to (EW5).

The structural unit TO is not particularly limited, and for example, may be selected from among substituted or unsubstituted aromatic hydrocarbon structures, substituted or unsubstituted aromatic heterocyclic structures, and structures containing one type, or two or more types, of these structures. In one embodiment, from the viewpoint of imparting durability without impairing the charge transport properties, the structural unit TO is preferably a substituted or unsubstituted aromatic hydrocarbon structure, and is more preferably a substituted or unsubstituted benzene structure. With the exception of the valency, the structural unit TO may have the same structure as the structural unit L. In one embodiment, from the viewpoint of imparting durability without impairing the charge transport properties, the structural unit T is preferably a substituted or unsubstituted aromatic hydrocarbon structure, and is more preferably a substituted or unsubstituted benzene structure.

Specific examples of the structural unit TO are shown below. However, the structural unit TO is not limited to the following structure.

[Chemical formula 17]

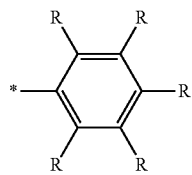

Each R independently represents a hydrogen atom or a substituent. It is preferable that each R is independently selected from a group consisting of $-R^1$, $-SR^3$, $-OCOR^4$, $-COOR^5$, $-SiR^6R^7R^8$ and halogen atoms. $R^1$ to $R^8$ are the same as $R^1$ to $R^8$ in the structural unit L.

In the charge transport polymer, the polymerizable functional group is introduced at least at a terminal portion of the charge transport polymer (namely, a structural unit T). The polymerizable functional group may also be introduced at a portion other than a terminal portion (namely, a structural unit L or B), or may be introduced at both a terminal portion and a portion other than a terminal. From the viewpoint of achieving a combination of favorable curability and favorable charge transport properties, the polymerizable functional group is preferably introduced only at terminal portions. Further, in those cases where the charge transport polymer has a branched structure, the polymerizable functional group may be introduced within the main chain of the charge transport polymer, within a side chain, or within both the main chain and a side chain.

From the viewpoint of obtaining a satisfactory change in the degree of solubility, the number of polymerizable functional groups per one molecule of the charge transport polymer is, for example, preferably at least 2, and more preferably 3 or greater. Further, from the viewpoint of maintaining good charge transport properties, the number of polymerizable functional groups is preferably not more than 1,000, and more preferably 500 or fewer.

Further, from the viewpoint of obtaining favorable curability, the proportion of the polymerizable functional group, based on the total of the polymerizable functional group and the terminal group EW, is preferably at least 5 mol %, more preferably at least 10 mol %, and even more preferably 20 mol % or greater. Further, from the viewpoint of obtaining favorable charge transport properties, the proportion of the polymerizable functional group, based on the total of the polymerizable functional group and the terminal group EW, is preferably not more than 85 mol %, more preferably not more than 80 mol %, and even more preferably 75 mol % or less.

The amount and proportion of polymerizable functional groups per molecule of the charge transport polymer can be determined as an average value from the amount of the polymerizable functional group used in synthesizing the charge transport polymer (for example, the amount added of the monomer having the polymerizable functional group× the number of polymerizable functional groups per monomer molecule), the amounts added of the monomers corresponding with the various structural units, and the mass average molecular weight of the charge transport polymer and the like. Further, the amount of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer, and the mass average molecular weight of the charge transport polymer and the like. In terms of simplicity, if the amounts added of the various components are clear, then the value determined using these amounts is preferably employed.

Number Average Molecular Weight

In the case of a linear charge transport polymer, the number average molecular weight of the charge transport polymer may be adjusted appropriately with due consideration of the solubility in solvents and the film formability and the like. From the viewpoint of ensuring superior charge transport properties, the number average molecular weight is preferably at least 500, more preferably at least 1,000, even more preferably at least 2,000, and still more preferably 3,000 or greater. Further, from the viewpoints of maintaining favorable solubility in solvents and facilitating the preparation of ink compositions, the number average molecular weight is preferably not more than 200,000, more preferably not more than 100,000, even more preferably not more than 50,000, and still more preferably 20,000 or less.

In the case of a branched charge transport polymer, the number average molecular weight of the charge transport polymer may be adjusted appropriately with due consideration of the solubility in solvents and the film formability and the like. From the viewpoint of ensuring superior charge transport properties, the number average molecular weight is preferably at least 500, more preferably at least 1,000, even more preferably at least 2,000, and still more preferably 5,000 or greater. Further, from the viewpoints of maintaining favorable solubility in solvents and facilitating the preparation of ink compositions, the number average molecular weight is preferably not more than 1,000,000, more preferably not more than 100,000, even more preferably not more than 50,000, and still more preferably 30,000 or less.

Mass Average Molecular Weight

In the case of a linear charge transport polymer, the mass average molecular weight of the charge transport polymer may be adjusted appropriately with due consideration of the solubility in solvents and the film formability and the like. From the viewpoint of ensuring superior charge transport properties, the mass average molecular weight is preferably at least 1,000, more preferably at least 3,000, even more preferably at least 5,000, and still more preferably 10,000 or greater. Further, from the viewpoints of maintaining favorable solubility in solvents and facilitating the preparation of ink compositions, the mass average molecular weight is preferably not more than 500,000, more preferably not more than 300,000, even more preferably not more than 150,000, and in order of preference, still more preferably 100,000 or less, or 50,000 or less.

In the case of a branched charge transport polymer, the mass average molecular weight of the charge transport polymer may be adjusted appropriately with due consideration of the solubility in solvents and the film formability and the like. From the viewpoint of ensuring superior charge transport properties, the mass average molecular weight is preferably at least 1,000, more preferably at least 5,000, even more preferably at least 10,000, and still more preferably 30,000 or greater. Further, from the viewpoints of maintaining favorable solubility in solvents and facilitating the preparation of ink compositions, the mass average molecular weight is preferably not more than 1,000,000, more preferably not more than 700,000, even more preferably not more than 400,000, and in order of preference, still more preferably 200,000 or less, or 100,000 or less.

The number average molecular weight and the mass average molecular weight can be measured by gel permeation chromatography (GPC) using a calibration curve of standard polystyrenes.

Proportions of Structural Units

In those cases where the charge transport polymer includes a structural unit L, from the viewpoint of ensuring satisfactory charge transport properties, the proportion of the structural unit L, based on the total of all the structural units, is preferably at least 10 mol %, more preferably at least 20 mol %, and even more preferably 30 mol % or higher. Further, if the structural unit T and the optionally introduced structural unit B are also taken into consideration, then the proportion of the structural unit L is preferably not more than 97 mol %, more preferably not more than 92 mol %, and even more preferably 85 mol % or less.

From the viewpoints of the solubility and the curability, the proportion of the structural unit T contained in the charge transport polymer, based on the total of all the structural units, is preferably at least 3 mol %, more preferably at least 8 mol %, and even more preferably 15 mol % or higher. A proportion within this range is also preferred from the viewpoint of improving the characteristics of the organic electronic element, and from the viewpoint of suppressing any increase in viscosity and enabling more favorable synthesis of the charge transport polymer. Further, from the viewpoint of obtaining satisfactory charge transport properties, the proportion of the structural unit T is preferably not more than 60 mol %, more preferably not more than 55 mol %, and even more preferably 50 mol % or less.

In those cases where the charge transport polymer includes a structural unit B, from the viewpoint of improving the durability of the organic electronic element, the proportion of the structural unit B, based on the total of all the structural units, is preferably at least 1 mol %, more preferably at least 5 mol %, and even more preferably 10 mol % or higher. Further, from the viewpoint of suppressing any increase in viscosity and enabling more favorable synthesis of the charge transport polymer, and from the viewpoint of ensuring satisfactory charge transport properties, the proportion of the structural unit B is preferably not more than 50 mol %, more preferably not more than 40 mol %, and even more preferably 30 mol % or less.

Considering the balance between the charge transport properties, the durability and the productivity and the like, the ratio (molar ratio) between the structural unit L and the structural unit T is preferably L:T=100:(1 to 70), more preferably 100:(3 to 50), and even more preferably 100:(5 to 30). Further, in those cases where the charge transport polymer also contains a structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

The proportion of each structural unit can be determined using the amount added of the monomer corresponding with that structural unit during synthesis of the charge transport polymer. Further, the proportion of each structural unit can also be calculated as an average value using the integral of the spectrum attributable to the structural unit in the $^1$H-NMR spectrum of the charge transport polymer. In terms of ease of calculation, if the amounts added are clear, then the proportion of the structural unit preferably employs the value determined using the amount added of the corresponding monomer. Further, the proportions of the terminal groups described above can also be determined in a similar manner.

From the viewpoint of stabilizing the film quality of the coating film, the degree of polymerization (the number of units of the structural units) for the charge transport polymer is preferably at least 5, more preferably at least 10, and even more preferably 20 or greater. Further, from the viewpoint of the solubility in solvents, the degree of polymerization is preferably not more than 1,000, more preferably not more than 700, and even more preferably 500 or less.

The degree of polymerization can be determined as an average value using the mass average molecular weight of the charge transport polymer, the molecular weight of each structural unit, and the proportion of each structural unit.

Production Method

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made, for example, to WO 2010/140553 in relation to synthesis methods for the charge transport polymer.

Charge Transport Material

According to one embodiment, a charge transport material contains at least the charge transport polymer described above. The charge transport material can be used favorably as an organic electronic material. The charge transport material may contain only one type, or may contain two or more types, of the charge transport polymer. In those cases where the charge transport material contains a plurality of types of the charge transport polymer, the overall mixture of charge transport polymers preferably satisfies the aforementioned configurations for the terminal group P and the terminal group EW.

Dopant

The charge transport material may also contain a dopant. There are no particular limitations on the dopant, provided it is a compound that yields a doping effect upon addition to the charge transport material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant. To improve the hole transport properties, p-type doping is preferred, whereas to improve the electron transport properties, n-type doping is preferred. The dopant used in the charge transport material may be a dopant that exhibits either a p-type doping effect or an n-type doping effect. Further, a single type of dopant may be added alone, or a mixture of a plurality of dopant types may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_5$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, TiCl$_4$, ZrCl$_4$, HfCl$_4$, NbF$_5$, AlCl$_3$, NbCl$_5$, TaCl$_5$ and MoF$_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, AsF$_6^-$ (hexafluoroarsenate ion), BF$_4^-$ (tetrafluoroborate ion) or PF$_6^-$ (hexafluorophosphate ion), and salts having a conjugate base of an aforementioned protonic acid as an anion; halogen compounds such as Cl$_2$, Br$_2$, I$_2$, ICl, ICl$_3$, IBr and IF; and π-conjugated compounds such as TCNE (tetracyanoethylene) and TCNQ (tetracyanoquinodimethane). Lewis acids, ionic compounds, and π-conjugated compounds and the like are preferred, and ionic compounds are more preferred. Among the various ionic compounds, onium salts are particularly desirable. Onium salts are compounds having a cation moiety that includes an onium ion such as an iodonium or ammonium ion, and a counter anion moiety.

The dopants used in n-type doping are electron-donating compounds, and examples include alkali metals such as Li and Cs; alkaline earth metals such as Mg and Ca; salts of alkali metals and/or alkaline earth metals such as LiF and Cs$_2$CO$_3$; metal complexes; and electron-donating organic compounds.

From the viewpoint of enabling favorably curing of the charge transport polymer, the use of a compound that can function as a polymerization initiator for the polymerizable functional group as the dopant is preferred. Examples of this type of compound include compounds represented by formula (1) shown below and compounds represented by formula (2) shown below.

Compounds Represented by Formula (1)

[Chemical formula 18]

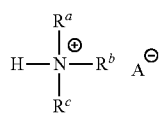

(1)

[In formula (1), each of $R^a$ to $R^c$ independently represents a hydrogen atom (H), an alkyl group or a benzyl group, wherein N is not bonded to an aryl group. A represents an anion.]

N is bonded to one or more hydrogen atoms (H), alkyl groups or benzyl groups, but is not bonded to an aryl group. As a result, the stability relative to heat and light tends to improve.

$R^a$ to $R^c$ may be the same or different. Two or more of $R^a$ to $R^c$ may be linked to form a ring. The alkyl group may be linear, branched or cyclic, may be substituted or unsubstituted, and may have, for example, 1 to 20 carbon atoms.

In one embodiment, from the viewpoint of improving the solubility in solvents, at least one of $R^a$ to $R^c$ is preferably an alkyl group or a benzyl group, and it is more preferable that at least two of $R^a$ to $R^c$ are alkyl groups and/or benzyl groups, and even more preferable that all of $R^a$ to $R^c$ are alkyl groups and/or benzyl groups.

In one embodiment, from the viewpoint of improving the thermal stability, all of $R^a$ to $R^c$ are preferably alkyl groups.

In one embodiment, from the viewpoint of improving the solubility in aromatic hydrocarbon-based solvents, at least one of $R^a$ to $R^c$ preferably has at least 6 carbon atoms, more preferably at least 9 carbon atoms, and even more preferably 12 or more carbon atoms.

In formula (1), there are no particular limitations on A, and any conventional anion may be used, but anions represented by formula (1b) to (5b) shown below are preferred from the viewpoint of improving characteristics such as reducing the drive voltage and enabling stable operation over long periods.

[Chemical formula 19]

(1b)

(2b)

(3b)

(4b)

(5b)

[In the formulas, $E^1$ represents an oxygen atom, $E^2$ represents a nitrogen atom, $E^3$ represents a carbon atom, $E^4$ represents a boron atom or a gallium atom, and $E^5$ represents a phosphorus atom or an antimony atom, each of $Y^1$ to $Y^6$ independently represents a single bond or a divalent linking group, each of $R^1$ to $R^{16}$ independently represents an electron-withdrawing monovalent group (wherein $R^2$ and $R^3$, at least two groups selected from among $R^4$ to $R^6$, at least two groups selected from among $R^7$ to $R^{10}$, and at least two groups selected from among $R^{11}$ to $R^{16}$, may each be bonded together).]

In formulas (1A) to (5A), each of $R^1$ to $R^{16}$ independently represents an electron-withdrawing monovalent group. An electron-withdrawing monovalent group describes a substituent which, compared with a hydrogen atom, withdraws electrons more readily from atoms bonded to the substituent. $R^1$ to $R^{16}$ are preferably organic groups. An organic group is an atom grouping containing one or more carbon atoms. This definition of an organic group also applies below. $R^2$ and $R^3$, at least two groups selected from among $R^4$ to $R^6$, at least two groups selected from among $R^7$ to $R^{10}$, and at least two groups selected from among $R^{11}$ to $R^{16}$, may each be bonded together. The bonded groups may form a ring.

Specific examples of the electron-withdrawing monovalent group include halogen atoms such as a fluorine atom, chlorine atom and bromine atom; a cyano group; a thiocyano group; a nitro group; alkylsulfonyl groups (typically having 1 to 12 carbon atoms, and preferably 1 to 6 carbon atoms) such as a mesyl group; arylsulfonyl groups (typically having 6 to 18 carbon atoms, and preferably 6 to 12 carbon atoms) such as a tosyl group; alkyloxysulfonyl groups (typically having 1 to 12 carbon atoms, and preferably 1 to 6 carbon atoms) such as a methoxysulfonyl group; aryloxysulfonyl groups (typically having 6 to 18 carbon atoms, and preferably 6 to 12 carbon atoms) such as a phenoxysulfonyl group; acyl groups (typically having 1 to 12 carbon atoms, and preferably 1 to 6 carbon atoms) such as a formyl group, acetyl group and benzoyl group; acyloxy groups (typically having 1 to 20 carbon atoms, and preferably 1 to 6 carbon atoms) such as a formyloxy group and an acetoxy group; alkoxycarbonyl groups (typically having 2 to 10 carbon atoms, and preferably 2 to 7 carbon atoms) such as a methoxycarbonyl group and an ethoxycarbonyl group; aryloxycarbonyl groups or heteroaryloxycarbonyl groups (typically having 4 to 25 carbon atoms, and preferably 5 to 15 carbon atoms) such as a phenoxycarbonyl group and a pyridyloxycarbonyl group; haloalkyl groups, haloalkenyl groups and haloalkynyl groups (typically having 1 to 10 carbon atoms, and preferably 1 to 6 carbon atoms) in which a linear, branched or cyclic alkyl group, alkenyl group or alkynyl group has been substituted with one or more halogen atoms, such as a trifluoromethyl group and a pentafluoroethyl group; haloaryl groups (typically having 6 to 20 carbon atoms, and preferably 6 to 12 carbon atoms) in which an aryl group has been substituted with one or more halogen atoms, such as a pentafluorophenyl group; and haloarylalkyl groups (typically having 7 to 19 carbon atoms, and 7 to 13 carbon atoms) in which an arylalkyl group has been substituted with one or more halogen atoms, such as a pentafluorophenylmethyl group.

Compounds Represented by Formula (2)

[Chemical formula 20]

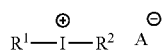
(2)

[Each of $R^1$ and $R^2$ independently represents a hydrogen atom or an organic group.]

From the viewpoints of the stability of the ionic compound and the solubility in solvents and the like, each of $R^1$ and $R^2$ preferably independently represents a hydrogen atom, or an alkyl group, alkenyl group, alkynyl group, arylalkyl group, aryl group or heteroaryl group. These groups may have a substituent. Further, $R^1$ and $R^2$ may be bonded together to form a ring. At least one group selected from among $R^1$ and $R^2$ is preferably an organic group, and $R^1$ and $R^2$ are more preferably both organic groups, and even more preferably both aryl groups.

Specific examples of onium salts include the compounds shown below.

[Chemical formula 21]

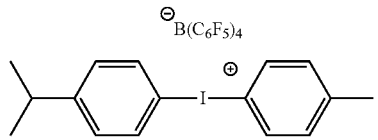

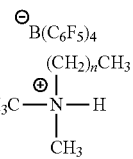

$n = 1 \sim 30$

Other Optional Components

The charge transport material may also contain charge transport low-molecular weight compounds, or other polymers or the like.

Contents

From the viewpoint of obtaining favorable charge transport properties, the amount of the charge transport polymer, relative to the total mass of the charge transport material, is preferably at least 50% by mass, more preferably at least 70% by mass, and even more preferably 80% by mass or greater. The amount may be 100% by mass.

When a dopant is included, from the viewpoint of improving the charge transport properties of the charge transport material, the amount of the dopant relative to the total mass of the charge transport material is preferably at least 0.01% by mass, more preferably at least 0.1% by mass, and even more preferably 0.5% by mass or greater. Further, from the viewpoint of maintaining favorable film formability, the amount of the dopant relative to the total mass of the charge transport material is preferably not more than 50% by mass, more preferably not more than 30% by mass, and even more preferably 20% by mass or less.

Ink Composition

According to one embodiment, an ink composition contains the charge transport material described above and a solvent that is capable of dissolving or dispersing the material. By using an ink composition, an organic layer can be formed easily using a simple coating method.

Solvent

Water, organic solvents, or mixed solvents thereof may be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin, phenylcyclohexane and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole and 3-phenoxytoluene; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride and the like. Aromatic hydrocarbons, aliphatic esters, aromatic esters, aliphatic ethers, and aromatic ethers are preferred, aromatic hydrocarbons, aromatic ethers and aromatic esters are more preferred, and aromatic hydrocarbons are even more preferred.

Polymerization Initiator

In those cases where the charge transport polymer has a polymerizable functional group, the ink composition preferably contains a polymerization initiator. Conventional radical polymerization initiators, cationic polymerization initiators, and anionic polymerization initiators and the like can be used as the polymerization initiator. From the viewpoint of enabling simple preparation of the ink composition, the use of a substance that exhibits both a function as a dopant and a function as a polymerization initiator is preferred. For example, the ionic compounds described above can be used favorably as cationic polymerization initiators that also exhibit a function as a dopant. Specific examples include salts of a perfluoro anion and a cation such as an iodonium ion or an ammonium ion.

Additives

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

Contents

The amount of the solvent in the ink composition can be determined with due consideration of the use of the composition in various coating methods. For example, the amount of the solvent is preferably an amount that yields a ratio of the charge transport polymer relative to the solvent that is at least 0.1% by mass, more preferably at least 0.2% by mass, and even more preferably 0.5% by mass or greater. Further, the amount of the solvent is preferably an amount that yields a ratio of the charge transport polymer relative to the solvent that is not more than 20% by mass, more preferably not more than 15% by mass, and even more preferably 10% by mass or less.

Organic Layer

According to one embodiment, an organic layer is a layer formed using the charge transport material described above or the ink composition described above, and contains a cured product of the charge transport polymer. By using the ink composition, an organic layer can be formed favorably by a coating method. Examples of the coating method include conventional methods such as spin coating methods; casting methods; dipping methods; plate-based printing methods such as relief printing, intaglio printing, offset printing, lithographic printing, relief reversal offset printing, screen printing and gravure printing; and plateless printing methods such as inkjet methods. When the organic layer is formed by a coating method, the coating film obtained following coating but before curing may be dried using a hotplate or an oven to remove the solvent.

By subjecting the coating film to light irradiation or a heat treatment or the like, the polymerization reaction for the charge transport polymer can be initiated, thereby changing the degree of solubility of the coating film. By stacking another layer on top of the cured organic layer (cured film) obtained following this change in the degree of solubility, multilayering of an organic electronic element can be performed with ease. Reference may also be made, for example, to WO 2010/140553 in relation to the method used for forming the organic layer.

From the viewpoint of improving the efficiency of charge transport, the thickness of the organic layer following curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

Organic Electronic Element

According to one embodiment, an organic electronic element has at least the organic layer described above. Examples of the organic electronic element include organic EL elements, organic photoelectric conversion elements, and organic transistors and the like. The organic electronic element preferably has at least a structure in which the organic layer is disposed between a pair of electrodes.

Organic EL Element

According to one embodiment, an organic EL element has at least the organic layer described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. Conventional materials may be used for the formation of each layer. For example, reference may be made to WO 2010/140553 in relation to conventional materials. The organic EL element preferably has the organic layer as the light-emitting layer or as a functional layer, more preferably has the organic layer as a functional layer, and even more preferably has the organic layer as at least one of a hole injection layer and a hole transport layer. Reference may also be made, for example, to WO 2010/140553 in relation to the structure and production method for the organic EL element.

The organic layer formed using the charge transport material described above is preferably used as at least one of a hole injection layer and a hole transport layer, and is more preferably used as at least a hole injection layer. As described above, by using an ink composition containing the charge transport material, these layers can be formed easily.

In those cases where the organic EL element has an organic layer formed using the charge transport material described above as a hole transport layer, and also has a hole injection layer, a conventional material may be used for the hole injection layer. Further, in those cases where the organic EL element has an organic layer formed using the charge transport material described above as a hole injection layer, and also has a hole transport layer, a conventional material may be used for the hole transport layer. Using the charge transport material for both the hole injection layer and the hole transport layer is also preferred.

Display Element, Illumination Device, Display Device

According to one embodiment, a display element contains the organic EL element described above. For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Further, according to one embodiment, an illumination device contains the organic EL element described above. Moreover, according to another embodiment, a display device contains the above illumination device and a liquid crystal element as a display unit. For example, the display device may be a device that uses the above illumination device as a backlight, and uses a conventional liquid crystal element as the display unit, namely a liquid crystal display device.

EXAMPLES

The present invention is described below in further detail using a series of examples, but the present invention is not limited by the following examples.

Synthesis of Charge Transport Polymers

Preparation of Pd Catalyst

In a glove box under a nitrogen atmosphere at room temperature, tris(dibenzylideneacetone)dipalladium (0.183 g, 0.200 mmol) was weighed into a sample container, toluene (40.00 ml) was added, and the resulting mixture was agitated for 10 minutes. In a similar manner, tris(tert-butyl)phosphine (0.324 g, 1.600 mmol) was weighed into a different sample container, toluene (10.00 ml) was added, and the resulting mixture was agitated for 10 minutes. The two solutions were then mixed together and stirred for 10 minutes at room temperature to obtain a Pd catalyst solution. All of the solvents used in this preparation of the Pd catalyst solution were deaerated under a nitrogen atmosphere by nitrogen bubbling at a supply rate of 1 l/minute for at least 30 minutes to reduce the oxygen concentration to not more than 0.5% by volume prior to use.

Synthesis of Charge Transport Polymers

The monomers used in the syntheses are shown below.

[Chemical formula 22]
| Difunctional Monomers (Structural unit L) | | Trifunctional Monomers (Structural unit B) | | Monofunctional Monomers | | | | | |
|---|---|---|---|---|---|---|---|---|---|
| | | | | Terminal group P (Structural unit TP) | | Terminal group EW (Structural unit TEW) | | Terminal group (Structural unit TO) | |
| L1 | | B1 | | T1 | | T12 | | T6 | |
| 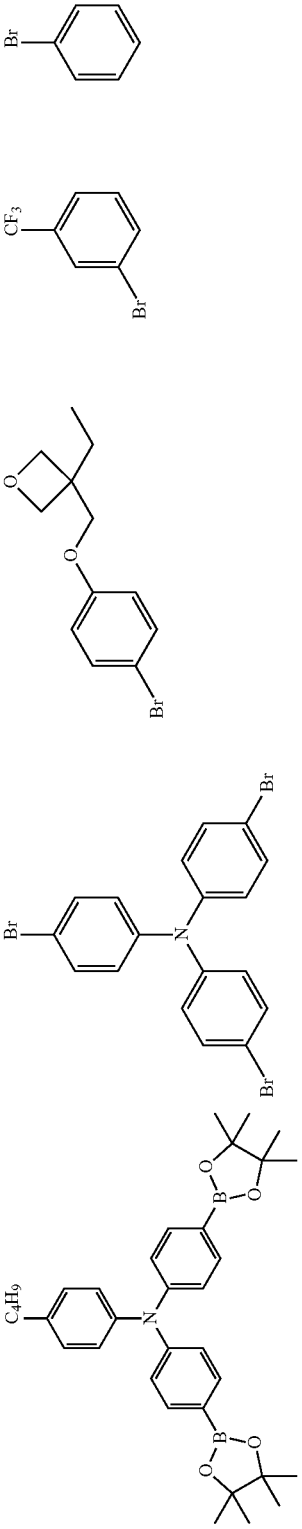 | | 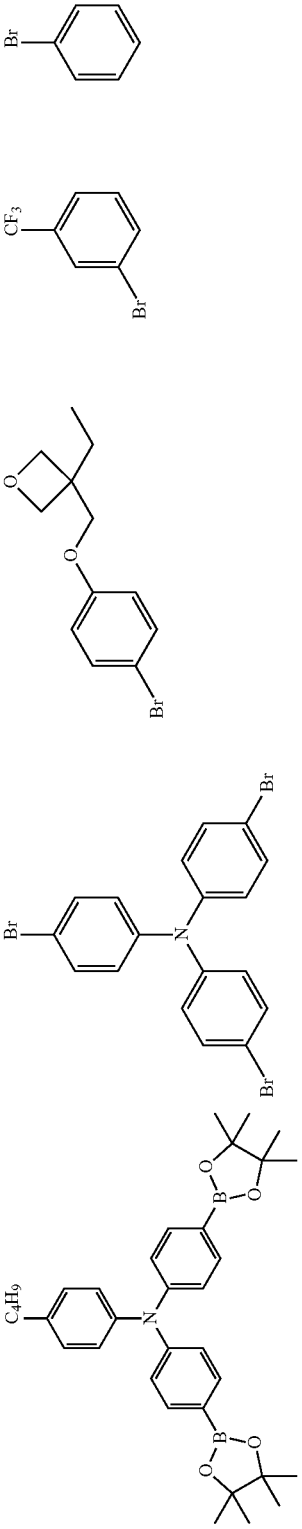 | | 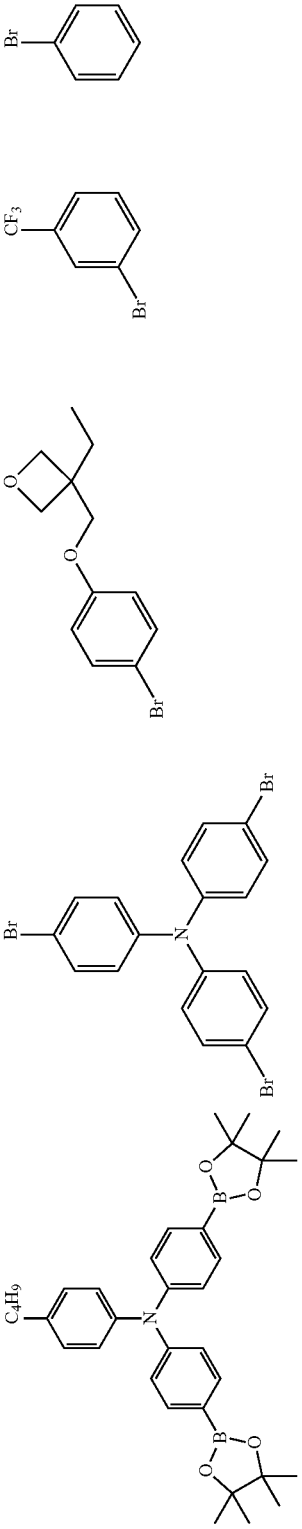 | | 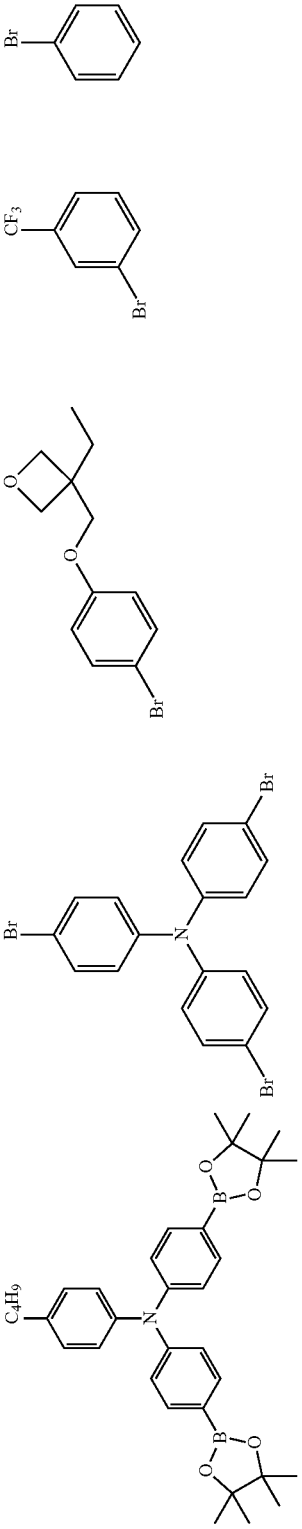 | | 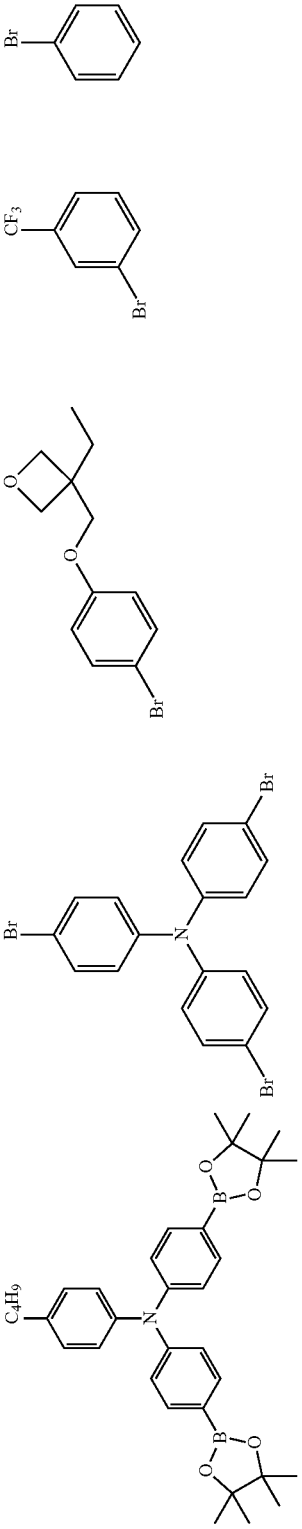 | |
| L2 | | B2 | | T2 | | T13 | | T7 | |
| 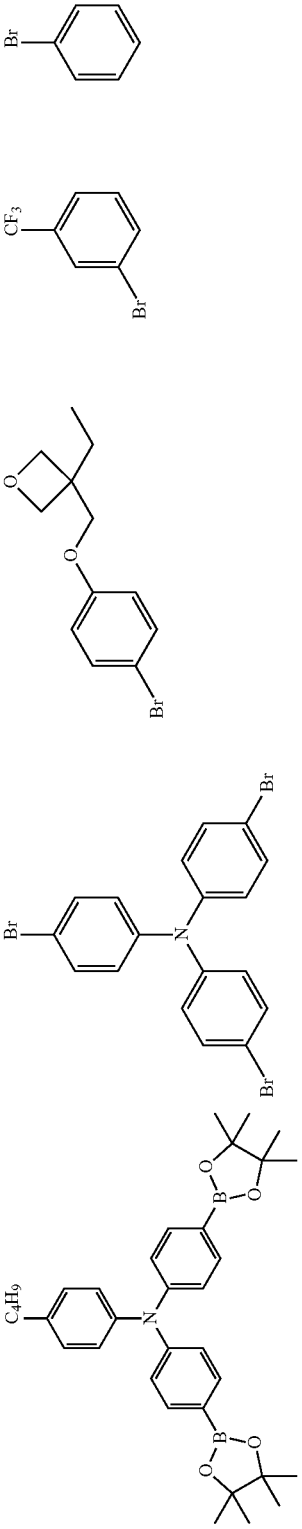 | | 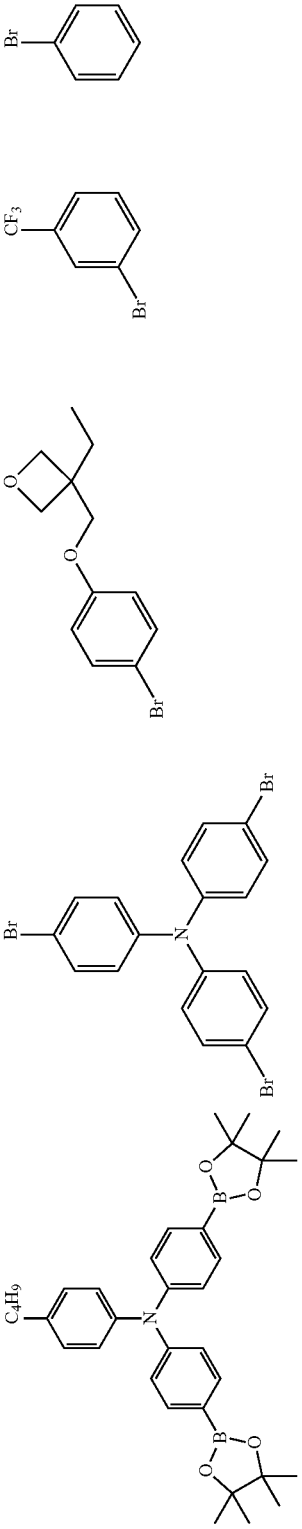 | | 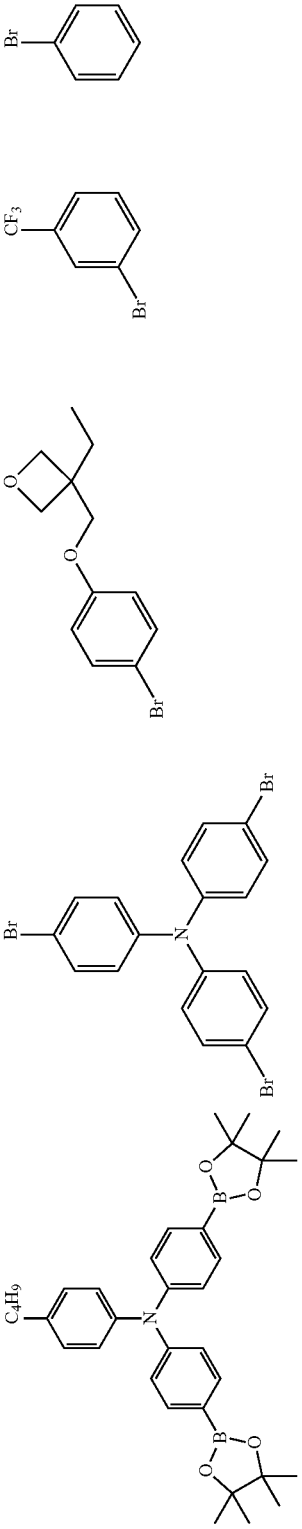 | | 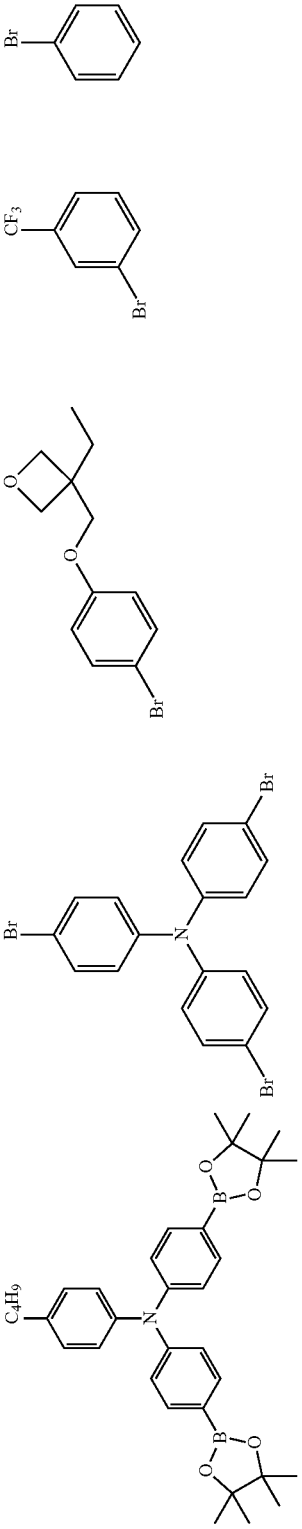 | | 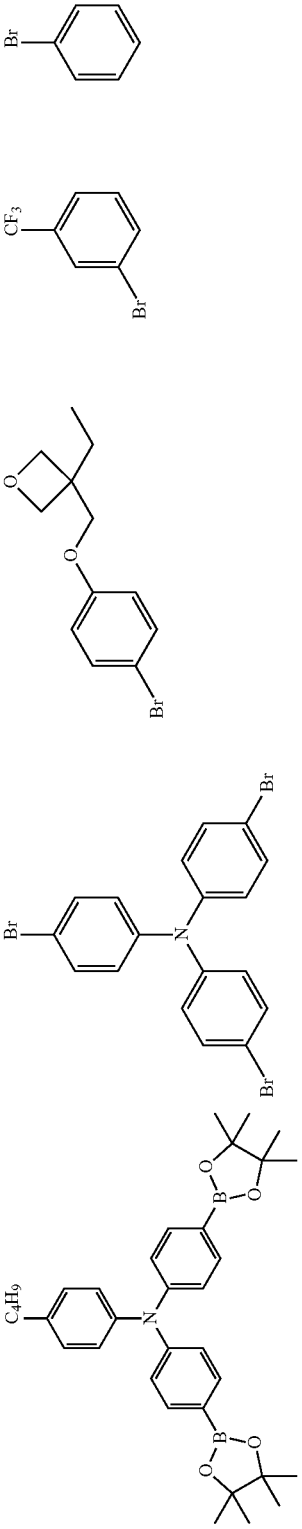 | |

-continued

| L3 | T3 | T8 | T15 |
|---|---|---|---|
| Tri(4-bromophenyl)(4-methylphenyl)amine: CH₃–C₆H₄–N(C₆H₄–Br)₂ | 3-bromostyrene | 1-bromo-3,5-dimethoxybenzene | 1-bromo-3,5-bis(trifluoromethyl)benzene |

| T4 | T9 |
|---|---|
| 4-bromostyrene | 1-bromo-3,5-dimethylbenzene |

| T5 | T10 |
|---|---|
| 2-bromo-3-methylthiophene | 1-bromo-4-fluorobenzene |

| T11 |
|---|
| 4-bromobenzotrifluoride |

Charge transport polymers were synthesized in the manner described below.

Example 1—Polymer E1

A three-neck round-bottom flask was charged with L1 (2.767 g, 5.0 mmol), B1 (0.964 g, 2.0 mmol), T1 (0.542 g, 2.0 mmol), T12 (0.450 g, 2.0 mmol), methyl tri-n-octyl ammonium chloride (0.034 g, Aliquat 336, manufactured by Alfa Aesar Ltd.), toluene (39.08 ml) and a 3.0 mol % aqueous potassium hydroxide solution (7.79 ml).

A stirring bar was placed in the three-neck round-bottom flask, and a condenser and a nitrogen supply line (nitrogen supply rate: 400 ml/minute) were fitted to the flask. Using an oil bath as the heating source, the mixture was stirred at 60° C. for 30 minutes to dissolve the above materials.

The separately prepared Pd catalyst solution described above (1.01 ml) was then added to the three-neck round-bottom flask, and the mixture was heated under reflux for two hours.

All of the solvents used in the synthesis were deaerated under a nitrogen atmosphere by nitrogen bubbling at a supply rate of 1 l/minute for at least 30 minutes to reduce the oxygen concentration to not more than 0.5% by volume prior to use.

Following completion of the reaction, the obtained organic layer was washed with water, the organic layer was then added to methanol-water (9:1), and the resulting precipitate was collected by filtration under reduced pressure.

The obtained precipitate and ethyl acetate (125 ml) were placed in a round-bottom flask, a stirring bar was placed in the flask, and a nitrogen supply line (nitrogen supply rate: 400 ml/minute) was fitted. Using an oil bath as the heating source, the mixture was stirred at 60° C. for 15 minutes to wash the precipitate with the ethyl acetate. Following washing, the washed precipitate was collected by filtration under reduced pressure. Using this washed precipitate, the ethyl acetate washing was repeated a further two times in the same manner as described above, thereby removing any residual monomers and ethyl acetate-soluble reaction products within the precipitate. Subsequently, the precipitate that had been washed with ethyl acetate was dried under vacuum (40° C.).

A round-bottom flask was charged with the vacuum-dried precipitate, a metal adsorbent including mercaptopropylsilane and amorphous silica (ISOLUTE Si-Thiol, manufactured by Biotage Japan Ltd., 20% by mass relative to the precipitate) and toluene (10% by mass relative to the precipitate), a stirring bar was then placed in the flask, and a nitrogen supply line (nitrogen supply rate: 400 ml/minute) was fitted. Using a water bath as the heating source, the mixture was stirred at 40° C. to dissolve the precipitate, and was then stirred for a further two hours to conduct an adsorption treatment with the metal adsorbent.

Following the adsorption treatment, the resulting mixture was filtered using a polytetrafluoroethylene (PTFE) filter (pore size: 0.2 μm) to remove the metal adsorbent.

The thus obtained filtrate was added to methanol, and the precipitate that formed was collected by filtration under reduced pressure. Subsequently, the collected precipitate was dried under vacuum (40° C.), with the mass being checked and any coarse particles crushed once per hour, and the point where no further change in mass was detected was deemed the end point of the vacuum drying process, yielding a charge transport polymer (the polymer E1).

The molar ratio of the terminal structural units T in the obtained polymer E1, based on the total number of moles of all the structural units, was 36.4 mol %. Further, the molar ratios of the structural unit TP and the structural unit TEW, based on the total number of moles of the structural unit TP and the structural unit TEW, were each 50 mol %.

Furthermore, the obtained polymer E1 had a mass average molecular weight of 58,600 and a number average molecular weight of 16,100.

The mass average molecular weight and the number average molecular weight were measured by GPC (relative to polystyrene standards) using tetrahydrofuran (THF) as the eluent. The measurement conditions were as follows.

Feed pump unit: LC-20AD, manufactured by Shimadzu Corporation
UV-VIS detector: SPD-20A, manufactured by Shimadzu Corporation
Detection wavelength: 254 nm
Columns: Gelpack (a registered trademark) GL-A160S/GL-A150S, manufactured by Hitachi Chemical Co., Ltd.
Eluent: THF (for HPLC, contains stabilizers), manufactured by Wako Pure Chemical Industries, Ltd.
Flow rate: 1 ml/min
Column temperature: 40° C.
Molecular weight standards: standard polystyrenes (PStQuick B/C/D), manufactured by Tosoh Corporation

Example 2—Polymer E2

A three-neck round-bottom flask was charged with L1 (2.767 g, 5.0 mmol), B1 (0.964 g, 2.0 mmol), T1 (0.542 g, 2.0 mmol), T13 (0.386 g, 2.0 mmol), methyl tri-n-octyl ammonium chloride (0.034 g, Aliquat 336, manufactured by Alfa Aesar Ltd.), toluene (38.54 ml) and a 3.0 mol % aqueous potassium hydroxide solution (7.79 ml).

Thereafter, the same method as Example 1 was used to produce a charge transport polymer (the polymer E2). The obtained polymer E2 had a mass average molecular weight of 58,200 and a number average molecular weight of 14,900.

Example 3—Polymer E3

A three-neck round-bottom flask was charged with L1 (2.767 g, 5.0 mmol), B1 (0.964 g, 2.0 mmol), T1 (0.054 g, 0.2 mmol), T15 (1.113 g, 3.8 mmol), methyl tri-n-octyl ammonium chloride (0.034 g, Aliquat 336, manufactured by Alfa Aesar Ltd.), toluene (40.57 ml) and a 3.0 mol % aqueous potassium hydroxide solution (7.79 ml).

Thereafter, the same method as Example 1 was used to prepare a charge transport polymer (the polymer E3). The obtained polymer E3 had a mass average molecular weight of 52,000 and a number average molecular weight of 15,500.

Example 4—Polymer E4

A three-neck round-bottom flask was charged with L1 (2.767 g, 5.0 mmol), B1 (0.964 g, 2.0 mmol), T1 (0.108 g, 0.4 mmol), T15 (1.055 g, 3.6 mmol), methyl tri-n-octyl ammonium chloride (0.034 g, Aliquat 336, manufactured by Alfa Aesar Ltd.), toluene (40.53 ml) and a 3.0 mol % aqueous potassium hydroxide solution (7.79 ml).

Thereafter, the same method as Example 1 was used to prepare a charge transport polymer (the polymer E4). The obtained polymer E4 had a mass average molecular weight of 54,700 and a number average molecular weight of 21,600.

Example 5—Polymer E5

A three-neck round-bottom flask was charged with L1 (2.767 g, 5.0 mmol), B1 (0.964 g, 2.0 mmol), T1 (0.163 g, 0.6 mmol), T15 (0.996 g, 3.4 mmol), methyl tri-n-octyl ammonium chloride (0.034 g, Aliquat 336, manufactured by Alfa Aesar Ltd.), toluene (40.50 ml) and a 3.0 mol % aqueous potassium hydroxide solution (7.79 ml).

Thereafter, the same method as Example 1 was used to prepare a charge transport polymer (the polymer E5). The obtained polymer E5 had a mass average molecular weight of 53,400 and a number average molecular weight of 21,400.

Example 6—Polymer E6

A three-neck round-bottom flask was charged with L1 (2.767 g, 5.0 mmol), B1 (0.964 g, 2.0 mmol), T1 (0.271 g, 1.0 mmol), T15 (0.879 g, 3.0 mmol), methyl tri-n-octyl ammonium chloride (0.034 g, Aliquat 336, manufactured by Alfa Aesar Ltd.), toluene (40.42 ml) and a 3.0 mol % aqueous potassium hydroxide solution (7.79 ml).

Thereafter, the same method as Example 1 was used to prepare a charge transport polymer (the polymer E6). The obtained polymer E6 had a mass average molecular weight of 74,200 and a number average molecular weight of 16,500.

Example 7—Polymer E7

A three-neck round-bottom flask was charged with L1 (2.767 g, 5.0 mmol), B1 (0.964 g, 2.0 mmol), T1 (0.542 g, 2.0 mmol), T15 (0.586 g, 2.0 mmol), methyl tri-n-octyl ammonium chloride (0.034 g, Aliquat 336, manufactured by Alfa Aesar Ltd.), toluene (40.24 ml) and a 3.0 mol % aqueous potassium hydroxide solution (7.79 ml).

Thereafter, the same method as Example 1 was used to prepare a charge transport polymer (the polymer E7). The obtained polymer E7 had a mass average molecular weight of 51,600 and a number average molecular weight of 17,300.

Example 8—Polymer E8

A three-neck round-bottom flask was charged with L1 (2.767 g, 5.0 mmol), B1 (0.964 g, 2.0 mmol), T1 (0.651 g, 2.4 mmol), T15 (0.469 g, 1.6 mmol), methyl tri-n-octyl ammonium chloride (0.034 g, Aliquat 336, manufactured by Alfa Aesar Ltd.), toluene (40.16 ml) and a 3.0 mol % aqueous potassium hydroxide solution (7.79 ml).

Thereafter, the same method as Example 1 was used to prepare a charge transport polymer (the polymer E8). The obtained polymer E8 had a mass average molecular weight of 55,600 and a number average molecular weight of 17,500.

Example 9—Polymer E9

A three-neck round-bottom flask was charged with L1 (2.767 g, 5.0 mmol), B1 (0.964 g, 2.0 mmol), T1 (0.814 g, 3.0 mmol), T15 (0.293 g, 1.0 mmol), methyl tri-n-octyl ammonium chloride (0.034 g, Aliquat 336, manufactured by Alfa Aesar Ltd.), toluene (40.05 ml) and a 3.0 mol % aqueous potassium hydroxide solution (7.79 ml).

Thereafter, the same method as Example 1 was used to prepare a charge transport polymer (the polymer E9). The obtained polymer E9 had a mass average molecular weight of 53,000 and a number average molecular weight of 16,300.

Example 10—Polymer E10

A three-neck round-bottom flask was charged with L2 (2.576 g, 5.0 mmol), B1 (0.964 g, 2.0 mmol), T1 (0.542 g, 2.0 mmol), T15 (0.586 g, 2.0 mmol), methyl tri-n-octyl ammonium chloride (0.034 g, Aliquat 336, manufactured by Alfa Aesar Ltd.), toluene (47.62 ml) and a 3.0 mol % aqueous potassium hydroxide solution (7.79 ml).

Thereafter, the same method as Example 1 was used to prepare a charge transport polymer (the polymer E10). The obtained polymer E10 had a mass average molecular weight of 53,400 and a number average molecular weight of 17,100.

Example 11—Polymer E11

A three-neck round-bottom flask was charged with L2 (2.576 g, 5.0 mmol), B1 (0.964 g, 2.0 mmol), T2 (0.683 g, 2.0 mmol), T15 (0.586 g, 2.0 mmol), methyl tri-n-octyl ammonium chloride (0.034 g, Aliquat 336, manufactured by Alfa Aesar Ltd.), toluene (62.97 ml) and a 3.0 mol % aqueous potassium hydroxide solution (7.79 ml).

Thereafter, the same method as Example 1 was used to prepare a charge transport polymer (the polymer E11). The obtained polymer E11 had a mass average molecular weight of 52,000 and a number average molecular weight of 17,700.

Example 12—Polymer E12

A three-neck round-bottom flask was charged with L2 (2.576 g, 5.0 mmol), B1 (0.964 g, 2.0 mmol), T3 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (58.77 ml) and a 3.0 mol % aqueous potassium hydroxide solution (7.79 ml).

Thereafter, the same method as Example 1 was used to prepare a charge transport polymer (the polymer E12). The obtained polymer E12 had a mass average molecular weight of 51,900 and a number average molecular weight of 17,600.

Example 13—Polymer E13

A three-neck round-bottom flask was charged with L2 (2.576 g, 5.0 mmol), B1 (0.964 g, 2.0 mmol), T3 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (45.78 ml) and a 3.0 mol % aqueous potassium hydroxide solution (7.79 ml).

Thereafter, the same method as Example 1 was used to prepare a charge transport polymer (the polymer E13). The obtained polymer E13 had a mass average molecular weight of 62,200 and a number average molecular weight of 18,600.

Example 14—Polymer E14

A three-neck round-bottom flask was charged with L2 (2.576 g, 5.0 mmol), B1 (0.964 g, 2.0 mmol), T3 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (37.13 ml) and a 3.0 mol % aqueous potassium hydroxide solution (7.79 ml).

Thereafter, the same method as Example 1 was used to prepare a charge transport polymer (the polymer E14). The obtained polymer E14 had a mass average molecular weight of 81,000 and a number average molecular weight of 20,000.

Example 15—Polymer E15

A three-neck round-bottom flask was charged with L2 (2.576 g, 5.0 mmol), B1 (0.964 g, 2.0 mmol), T3 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (26.31 ml) and a 3.0 mol % aqueous potassium hydroxide solution (7.79 ml).

Thereafter, the same method as Example 1 was used to prepare a charge transport polymer (the polymer E15). The obtained polymer E15 had a mass average molecular weight of 112,700 and a number average molecular weight of 21,400.

Example 16—Polymer E16

A three-neck round-bottom flask was charged with L2 (2.576 g, 5.0 mmol), B1 (0.964 g, 2.0 mmol), T4 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (58.77 ml) and a 3.0 mol % aqueous potassium hydroxide solution (7.79 ml).

Thereafter, the same method as Example 1 was used to prepare a charge transport polymer (the polymer E16). The obtained polymer E16 had a mass average molecular weight of 54,200 and a number average molecular weight of 17,200.

Example 17—Polymer E17

A three-neck round-bottom flask was charged with L2 (2.576 g, 5.0 mmol), B1 (0.964 g, 2.0 mmol), T5 (0.354 g, 2.0 mmol), T15 (0.586 g, 2.0 mmol), methyl tri-n-octyl ammonium chloride (0.034 g, Aliquat 336, manufactured by Alfa Aesar Ltd.), toluene (58.61 ml) and a 3.0 mol % aqueous potassium hydroxide solution (7.79 ml).

Thereafter, the same method as Example 1 was used to prepare a charge transport polymer (the polymer E17). The obtained polymer E17 had a mass average molecular weight of 55,500 and a number average molecular weight of 18,200.

Example 18—Polymer E18

A three-neck round-bottom flask was charged with L2 (2.576 g, 5.0 mmol), B2 (0.960 g, 2.0 mmol), T3 (0.366 g, 2.0 mmol), T15 (0.586 g, 2.0 mmol), methyl tri-n-octyl ammonium chloride (0.034 g, Aliquat 336, manufactured by Alfa Aesar Ltd.), toluene (67.98 ml) and a 3.0 mol % aqueous potassium hydroxide solution (7.79 ml).

Thereafter, the same method as Example 1 was used to prepare a charge transport polymer (the polymer E18). The obtained polymer E18 had a mass average molecular weight of 121,000 and a number average molecular weight of 17,000.

Example 19—Polymer E19

A three-neck round-bottom flask was charged with L1 (3.043 g, 5.500 mmol), L3 (2.086 g, 5.000 mmol), methyl tri-n-octyl ammonium chloride (0.044 g, Aliquat 336, manufactured by Alfa Aesar Ltd.), toluene (42.43 ml) and a 3.0 mol % aqueous potassium hydroxide solution (10.13 ml).

A stirring bar was placed in the three-neck round-bottom flask, and a reflux condenser and a nitrogen supply line (nitrogen supply rate: 400 ml/minute) were fitted to the flask. Using an oil bath as the heating source, the mixture was stirred at 60° C. for 30 minutes to dissolve the above materials.

The separately prepared Pd catalyst solution described above (1.11 ml) was then added to the three-neck round-bottom flask, and after heating the mixture under reflux for 30 minutes, a prepared toluene solution (a solution containing T1 (0.542 g, 2.0 mmol) and T15 (0.586 g, 2.0 mmol) added to toluene (3.64 ml)) was added to the flask, and heating under reflux was continued for a further one hour.

Thereafter, the same method as Example 1 was used to prepare a charge transport polymer (the polymer E19). The obtained polymer E19 had a mass average molecular weight of 10,300 and a number average molecular weight of 6,800.

Comparative Example 1—Polymer C1

A three-neck round-bottom flask was charged with L1 (2.767 g, 5.0 mmol), B1 (0.964 g, 2.0 mmol), T1 (1.085 g, 4.0 mmol), methyl tri-n-octyl ammonium chloride (0.034 g, Aliquat 336, manufactured by Alfa Aesar Ltd.), toluene (39.87 ml) and a 3.0 mol % aqueous potassium hydroxide solution (7.79 ml).

Thereafter, the same method as Example 1 was used to produce a charge transport polymer (the polymer C1). The obtained polymer C1 had a mass average molecular weight of 58,800 and a number average molecular weight of 15,400.

Comparative Example 2—Polymer C2

A three-neck round-bottom flask was charged with L1 (2.767 g, 5.0 mmol), B1 (0.964 g, 2.0 mmol), T1 (0.542 g, 2.0 mmol), T6 (0.314 g, 2.0 mmol), methyl tri-n-octyl ammonium chloride (0.034 g, Aliquat 336, manufactured by Alfa Aesar Ltd.), toluene (37.93 ml) and a 3.0 mol % aqueous potassium hydroxide solution (7.79 ml).

Thereafter, the same method as Example 1 was used to produce a charge transport polymer (the polymer C2). The obtained polymer C2 had a mass average molecular weight of 62,400 and a number average molecular weight of 12,600.

Comparative Example 3—Polymer C3

A three-neck round-bottom flask was charged with L1 (2.767 g, 5.0 mmol), B1 (0.964 g, 2.0 mmol), T1 (0.542 g, 2.0 mmol), T7 (0.538 g, 2.0 mmol), methyl tri-n-octyl ammonium chloride (0.034 g, Aliquat 336, manufactured by Alfa Aesar Ltd.), toluene (39.83 ml) and a 3.0 mol % aqueous potassium hydroxide solution (7.79 ml).

Thereafter, the same method as Example 1 was used to produce a charge transport polymer (the polymer C3). The obtained polymer C3 had a mass average molecular weight of 51,500 and a number average molecular weight of 15,000.

Comparative Example 4—Polymer C4

A three-neck round-bottom flask was charged with L1 (2.767 g, 5.0 mmol), B1 (0.964 g, 2.0 mmol), T1 (0.542 g, 2.0 mmol), T8 (0.434 g, 2.0 mmol), methyl tri-n-octyl ammonium chloride (0.034 g, Aliquat 336, manufactured by Alfa Aesar Ltd.), toluene (38.95 ml) and a 3.0 mol % aqueous potassium hydroxide solution (7.79 ml).

Thereafter, the same method as Example 1 was used to produce a charge transport polymer (the polymer C4). The obtained polymer C4 had a mass average molecular weight of 53,700 and a number average molecular weight of 14,200.

Comparative Example 5—Polymer C5

A three-neck round-bottom flask was charged with L1 (2.767 g, 5.0 mmol), B1 (0.964 g, 2.0 mmol), T1 (0.542 g, 2.0 mmol), T9 (0.370 g, 2.0 mmol), methyl tri-n-octyl ammonium chloride (0.034 g, Aliquat 336, manufactured by Alfa Aesar Ltd.), toluene (38.41 ml) and a 3.0 mol % aqueous potassium hydroxide solution (7.79 ml).

Thereafter, the same method as Example 1 was used to produce a charge transport polymer (the polymer C5). The obtained polymer C5 had a mass average molecular weight of 57,500 and a number average molecular weight of 13,600.

Comparative Example 6—Polymer C6

A three-neck round-bottom flask was charged with L1 (2.767 g, 5.0 mmol), B1 (0.964 g, 2.0 mmol), T1 (0.542 g, 2.0 mmol), T10 (0.350 g, 2.0 mmol), methyl tri-n-octyl ammonium chloride (0.034 g, Aliquat 336, manufactured by Alfa Aesar Ltd.), toluene (38.24 ml) and a 3.0 mol % aqueous potassium hydroxide solution (7.79 ml).

Thereafter, the same method as Example 1 was used to produce a charge transport polymer (the polymer C6). The obtained polymer C6 had a mass average molecular weight of 54,300 and a number average molecular weight of 11,500.

Comparative Example 7—Polymer C7

A three-neck round-bottom flask was charged with L1 (2.767 g, 5.0 mmol), B1 (0.964 g, 2.0 mmol), T1 (0.542 g, 2.0 mmol), T11 (0.450 g, 2.0 mmol), methyl tri-n-octyl ammonium chloride (0.034 g, Aliquat 336, manufactured by Alfa Aesar Ltd.), toluene (39.08 ml) and a 3.0 mol % aqueous potassium hydroxide solution (7.79 ml).

Thereafter, the same method as Example 1 was used to produce a charge transport polymer (the polymer C7). The obtained polymer C7 had a mass average molecular weight of 55,900 and a number average molecular weight of 14,200.

Comparative Example 8—Polymer C8

A three-neck round-bottom flask was charged with L2 (2.576 g, 5.0 mmol), B1 (0.964 g, 2.0 mmol), T2 (1.365 g, 4.0 mmol), methyl tri-n-octyl ammonium chloride (0.034 g, Aliquat 336, manufactured by Alfa Aesar Ltd.), toluene (64.26 ml) and a 3.0 mol % aqueous potassium hydroxide solution (7.79 ml).

Thereafter, the same method as Example 1 was used to produce a charge transport polymer (the polymer C8). The obtained polymer C8 had a mass average molecular weight of 45,600 and a number average molecular weight of 17,100.

Comparative Example 9—Polymer C9

A three-neck round-bottom flask was charged with L2 (2.576 g, 5.0 mmol), B1 (0.964 g, 2.0 mmol), T1 (0.542 g, 2.0 mmol), T7 (0.538 g, 2.0 mmol), methyl tri-n-octyl ammonium chloride (0.034 g, Aliquat 336, manufactured by Alfa Aesar Ltd.), toluene (47.21 ml) and a 3.0 mol % aqueous potassium hydroxide solution (7.79 ml).

Thereafter, the same method as Example 1 was used to produce a charge transport polymer (the polymer C9). The obtained polymer C9 had a mass average molecular weight of 53,900 and a number average molecular weight of 14,900.

Comparative Example 10—Polymer C10

A three-neck round-bottom flask was charged with L2 (2.576 g, 5.0 mmol), B1 (0.964 g, 2.0 mmol), T2 (0.683 g, 2.0 mmol), T7 (0.538 g, 2.0 mmol), methyl tri-n-octyl ammonium chloride (0.034 g, Aliquat 336, manufactured by Alfa Aesar Ltd.), toluene (62.34 ml) and a 3.0 mol % aqueous potassium hydroxide solution (7.79 ml).

Thereafter, the same method as Example 1 was used to produce a charge transport polymer (the polymer C10). The obtained polymer C10 had a mass average molecular weight of 51,100 and a number average molecular weight of 17,300.

Comparative Example 11—Polymer C11

A three-neck round-bottom flask was charged with L2 (2.576 g, 5.0 mmol), B1 (0.964 g, 2.0 mmol), T3 (0.366 g, 2.0 mmol), T7 (0.538 g, 2.0 mmol), methyl tri-n-octyl ammonium chloride (0.034 g, Aliquat 336, manufactured by Alfa Aesar Ltd.), toluene (67.31 ml) and a 3.0 mol % aqueous potassium hydroxide solution (7.79 ml).

Thereafter, the same method as Example 1 was used to produce a charge transport polymer (the polymer C11). The obtained polymer C11 had a mass average molecular weight of 52,700 and a number average molecular weight of 13,200.

Comparative Example 12—Polymer C12

A three-neck round-bottom flask was charged with L2 (2.576 g, 5.0 mmol), B1 (0.964 g, 2.0 mmol), T4 (0.366 g, 2.0 mmol), T7 (0.538 g, 2.0 mmol), methyl tri-n-octyl ammonium chloride (0.034 g, Aliquat 336, manufactured by Alfa Aesar Ltd.), toluene (67.31 ml) and a 3.0 mol % aqueous potassium hydroxide solution (7.79 ml).

Thereafter, the same method as Example 1 was used to produce a charge transport polymer (the polymer C12). The obtained polymer C12 had a mass average molecular weight of 60,800 and a number average molecular weight of 13,700.

Comparative Example 13—Polymer C13

A three-neck round-bottom flask was charged with L2 (2.576 g, 5.0 mmol), B1 (0.964 g, 2.0 mmol), T5 (0.354 g, 2.0 mmol), T7 (0.538 g, 2.0 mmol), methyl tri-n-octyl ammonium chloride (0.034 g, Aliquat 336, manufactured by Alfa Aesar Ltd.), toluene (67.13 ml) and a 3.0 mol % aqueous potassium hydroxide solution (7.79 ml).

Thereafter, the same method as Example 1 was used to produce a charge transport polymer (the polymer C13). The obtained polymer C13 had a mass average molecular weight of 57,100 and a number average molecular weight of 13,600.

Comparative Example 14—Polymer C14

A three-neck round-bottom flask was charged with L2 (2.576 g, 5.0 mmol), B2 (0.960 g, 2.0 mmol), T3 (0.366 g, 2.0 mmol), T7 (0.538 g, 2.0 mmol), methyl tri-n-octyl ammonium chloride (0.034 g, Aliquat 336, manufactured by Alfa Aesar Ltd.), toluene (67.25 ml) and a 3.0 mol % aqueous potassium hydroxide solution (7.79 ml).

Thereafter, the same method as Example 1 was used to produce a charge transport polymer (the polymer C14). The obtained polymer C14 had a mass average molecular weight of 114,500 and a number average molecular weight of 16,600.

Comparative Example 15—Polymer C15

A three-neck round-bottom flask was charged with L1 (3.043 g, 5.500 mmol), L3 (2.086 g, 5.000 mmol), methyl tri-n-octyl ammonium chloride (0.044 g, Aliquat 336, manufactured by Alfa Aesar Ltd.), toluene (42.43 ml) and a 3.0 mol % aqueous potassium hydroxide solution (10.13 ml).

A stirring bar was placed in the three-neck round-bottom flask, and a reflux condenser and a nitrogen supply line (nitrogen supply rate: 400 ml/minute) were fitted to the flask.

Using an oil bath as the heating source, the mixture was stirred at 60° C. for 30 minutes to dissolve the above materials.

The separately prepared Pd catalyst solution described above (1.11 ml) was then added to the three-neck round-bottom flask, and after heating the mixture under reflux for 30 minutes, a prepared toluene solution (a solution containing T1 (0.542 g, 2.0 mmol) and T7 (0.538 g, 2.0 mmol) added to toluene (3.66 ml)) was added to the flask, and heating under reflux was continued for a further one hour.

Thereafter, the same method as Example 1 was used to prepare a charge transport polymer (the polymer C15). The obtained polymer C15 had a mass average molecular weight of 10,400 and a number average molecular weight of 6,400.

For each of the polymers E1 to E19 and the polymers C1 to C15, the monomers used in the synthesis (namely, the structural units contained in the polymer), the molar ratio (%) of the structural units T, the molar ratios (%) of the structural unit TP and the structural unit TEW, the mass average molecular weight and the number average molecular weight are shown in Table 1 or Table 2.

TABLE 1

| Examples | L | B | \multicolumn{2}{c}{T (molar ratio)} | Mass average molecular weight | Number average molecular weight | Molar ratio of structural unit T |
|---|---|---|---|---|---|---|---|
| Polymer E1 | L1 | B1 | T1 (50) | T12 (50) | 58,600 | 16,100 | 36.4 |
| Polymer E2 | L1 | B1 | T1 (50) | T13 (50) | 58,200 | 14,900 | 36.4 |
| Polymer E7 | L1 | B1 | T1 (50) | T15 (50) | 51,600 | 17,300 | 36.4 |
| Polymer E3 | L1 | B1 | T1 (5) | T15 (95) | 52,000 | 15,500 | 36.4 |
| Polymer E4 | L1 | B1 | T1 (10) | T15 (90) | 54,700 | 21,600 | 36.4 |
| Polymer E5 | L1 | B1 | T1 (15) | T15 (85) | 53,400 | 21,400 | 36.4 |
| Polymer E6 | L1 | B1 | T1 (25) | T15 (75) | 74,200 | 16,500 | 36.4 |
| Polymer E7 | L1 | B1 | T1 (50) | T15 (50) | 51,600 | 17,300 | 36.4 |
| Polymer E8 | L1 | B1 | T1 (60) | T15 (40) | 55,600 | 17,500 | 36.4 |
| Polymer E9 | L1 | B1 | T1 (75) | T15 (25) | 53,000 | 16,300 | 36.4 |
| Polymer E10 | L2 | B1 | T1 (50) | T15 (50) | 53,400 | 17,100 | 36.4 |
| Polymer E11 | L2 | B1 | T2 (50) | T15 (50) | 52,000 | 17,700 | 36.4 |
| Polymer E12 | L2 | B1 | T3 (50) | T15 (50) | 51,900 | 17,600 | 36.4 |
| Polymer E16 | L2 | B1 | T4 (50) | T15 (50) | 54,200 | 17,200 | 36.4 |
| Polymer E17 | L2 | B1 | T5 (50) | T15 (50) | 55,500 | 18,200 | 36.4 |
| Polymer E12 | L2 | B1 | T3 (50) | T15 (50) | 51,900 | 17,600 | 36.4 |
| Polymer E13 | L2 | B1 | T3 (50) | T15 (50) | 62,200 | 18,600 | 36.4 |
| Polymer E14 | L2 | B1 | T3 (50) | T15 (50) | 81,000 | 20,000 | 36.4 |
| Polymer E15 | L2 | B1 | T3 (50) | T15 (50) | 112,700 | 21,400 | 36.4 |
| Polymer E18 | L2 | B2 | T3 (50) | T15 (50) | 121,000 | 17,000 | 36.4 |
| Polymer E19 | L1/L3 | — | T3 (50) | T15 (50) | 10,300 | 6,800 | 8.7 |

TABLE 2

| Comparative Examples | L | B | \multicolumn{2}{c}{T (molar ratio)} | Mass average molecular weight | Number average molecular weight | Molar ratio of structural unit T |
|---|---|---|---|---|---|---|---|
| Polymer C1 | L1 | B1 | T1 (100) | | 58,800 | 15,400 | 36.4 |
| Polymer C2 | L1 | B1 | T1 (50) | T6 (50) | 62,400 | 12,600 | 36.4 |
| Polymer C3 | L1 | B1 | T1 (50) | T7 (50) | 51,500 | 15,000 | 36.4 |

TABLE 2-continued

| Comparative Examples | Monomers (structural units) | | T (molar ratio) | | Mass average molecular weight | Number average molecular weight | Molar ratio of structural unit T |
|---|---|---|---|---|---|---|---|
| | L | B | | | | | |
| Polymer C4 | L1 | B1 | T1 (50) | T8 (50) | 53,700 | 14,200 | 36.4 |
| Polymer C5 | L1 | B1 | T1 (50) | T9 (50) | 57,500 | 13,600 | 36.4 |
| Polymer C6 | L1 | B1 | T1 (50) | T10 (50) | 54,300 | 11,500 | 36.4 |
| Polymer C7 | L1 | B1 | T1 (50) | T11 (50) | 55,900 | 14,200 | 36.4 |
| Polymer C8 | L2 | B1 | T2 (100) | | 45,600 | 17,100 | 36.4 |
| Polymer C9 | L2 | B1 | T1 (50) | T7 (50) | 53,900 | 14,900 | 36.4 |
| Polymer C10 | L2 | B1 | T2 (50) | T7 (50) | 51,100 | 17,300 | 36.4 |
| Polymer C11 | L2 | B1 | T3 (50) | T7 (50) | 52,700 | 13,200 | 36.4 |
| Polymer C12 | L2 | B1 | T4 (50) | T7 (50) | 60,800 | 13,700 | 36.4 |
| Polymer C13 | L2 | B1 | T5 (50) | T7 (50) | 57,100 | 13,600 | 36.4 |
| Polymer C14 | L2 | B2 | T3 (50) | T7 (50) | 114,500 | 16,600 | 36.4 |
| Polymer C15 | L1/L3 | — | T1 (50) | T7 (50) | 10,400 | 6,400 | 8.7 |

Solubility Evaluations

Evaluations of the solubility in solvents of each of the polymers E1 to E19 and the polymers C1 to C15 were conducted in the manner described below.

Solubility in Toluene

Dissolution Time Test

Coarse particles contained in the polymer were crushed using a mortar to convert the polymer to a powder having a uniform particle size. In order to achieve an amount of the polymer of 1.0% by mass relative to the mass of the solution, and a solution volume of 1 ml, the polymer (8.7 mg) was weighed into a 6 ml screw-top vial, and toluene (865.0 mg) (25° C.) was added. Subsequently, a stirring bar (10×ø4 mm) was placed in the vial, and the contents were stirred (600 rpm) in a water bath (25° C.).

The time taken from the start of stirring for the polymer to completely dissolve was measured. A "completely dissolved" state was deemed to indicate a state where visual inspection clearly revealed a transparent solution, with no insoluble polymer and no turbidity.

In the examples, a powder having a uniform particle size refers to a powder for which the volume-based average particle size is from 20 to 40 μm. The average particle size represents the median diameter measured using a laser diffraction/scattering particle size distribution analyzer.

By comparing the dissolution times for the polymers of the examples with the dissolution times for the polymers of the respective comparative examples, a time reduction could be calculated. The polymer of each example was compared with the polymer of the comparative example that had the same structural units except for a different terminal structural unit TEW. Calculation of the time reduction was performed using the formula shown below.

$$\text{Time reduction (\%)} = \{\text{dissolution time (minutes) for polymer of comparative example} - \text{dissolution time (minutes) for polymer of example}\}/\text{dissolution time (minutes) for polymer of comparative example} \times 100 \quad [\text{Numerical formula 1}]$$

Using the calculated "time reduction" as an indicator, the "dissolution time" for the polymer of each example in toluene was evaluated using the following 7-step scale. For reference purposes, a dissolution time evaluation was also conducted for the polymers C2 and C4 to C7 of the comparative examples.

A: time reduction exceeds 50%
B: time reduction exceeds 40% but not more than 50%
C: time reduction exceeds 30% but not more than 40%
D: time reduction exceeds 20% but not more than 30%
E: time reduction exceeds 10% but not more than 20%
F: time reduction exceeds 0% but not more than 10%
G: time reduction of 0% or less Soluble Concentration Test Coarse particles contained in the polymer were crushed using a mortar to convert the polymer to a powder having a uniform particle size. The polymer and toluene (25° C.) were added to a series of 6 ml screw-top vials to achieve amounts of the polymer relative to the mass of the solution of 4.0% by mass, 3.0% by mass, 2.0% by mass and 1.0% by mass, and the vials were shaken in an environment at 25° C. to ascertain whether or not the polymer would dissolve (soluble or insoluble). An evaluation of "soluble" was deemed to indicate a state where visual inspection clearly revealed a transparent solution, with no insoluble polymer and no turbidity.

The "soluble concentration" of the polymer in toluene was evaluated using the following 4-step scale.

A: polymer soluble at concentrations of 4.0% by mass and 3.0% by mass
B: polymer soluble at a concentration of 2.0% by mass, but insoluble at a concentration of 3.0% by mass C: polymer soluble at a concentration of 1.0% by mass, but insoluble at a concentration of 2.0% by mass D: polymer insoluble at a concentration of 1.0% by mass Solubility in Anisole Dissolution Time Test Coarse particles contained in the polymer were crushed using a mortar to convert the polymer to a powder having a uniform particle size. In order to achieve an amount of the polymer of 1.0% by mass relative to the mass of the solution, and a solution volume of 1 ml, the polymer (10.1 mg) was weighed into a 6 ml screw-top vial, and anisole (1,002.0 mg) (25° C.) was added. Subsequently, a stirring bar (10×ø4 mm) was placed in the vial, and the contents were stirred (600 rpm) in a water bath (25° C.).

The time taken from the start of stirring for the polymer to completely dissolve was measured. A "completely dissolved" state was deemed to indicate a state where visual inspection clearly revealed a transparent solution, with no insoluble polymer and no turbidity.

The "time reduction" was calculated in the same manner as that described for the solubility in toluene, and the "dissolution time" for the polymer in anisole was evaluated using the following 7-step scale.

A: time reduction exceeds 50%
B: time reduction exceeds 40% but not more than 50%
C: time reduction exceeds 30% but not more than 40%
D: time reduction exceeds 20% but not more than 30%
E: time reduction exceeds 10% but not more than 20%
F: time reduction exceeds 0% but not more than 10%
G: time reduction of 0% or less Soluble Concentration Test Coarse particles contained in the polymer were crushed using a mortar to convert the polymer to a powder having a uniform particle size. The polymer and anisole (25° C.) were added to a series of 6 ml screw-top vials to achieve amounts of the polymer relative to the mass of the solution of 4.0% by mass, 3.0% by mass, 2.0% by mass and 1.0% by mass, and the vials were shaken in an environment at 25° C. to ascertain whether or not the polymer would dissolve (soluble or insoluble). An evaluation of "soluble" was deemed to indicate a state where visual inspection clearly revealed a transparent solution, with no insoluble polymer and no turbidity.

The "soluble concentration" of the polymer in anisole was evaluated using the following 4-step scale.

A: polymer soluble at concentrations of 4.0% by mass and 3.0% by mass
B: polymer soluble at a concentration of 2.0% by mass, but insoluble at a concentration of 3.0% by mass
C: polymer soluble at a concentration of 1.0% by mass, but insoluble at a concentration of 2.0% by mass
D: polymer insoluble at a concentration of 1.0% by mass Solubility in Butyl Benzoate Dissolution Time Test Coarse particles contained in the polymer were crushed using a mortar to convert the polymer to a powder having a uniform particle size. In order to achieve an amount of the polymer of 1.0% by mass relative to the mass of the solution, and a solution volume of 1 ml, the polymer (10.2 mg) was weighed into a 6 ml screw-top vial, and butyl benzoate (1,007.0 mg) (25° C.) was added. Subsequently, a stirring bar (10×ø4 mm) was placed in the vial, and the contents were stirred (600 rpm) in a water bath (25° C.).

The time taken from the start of stirring for the polymer to completely dissolve was measured. A "completely dissolved" state was deemed to indicate a state where visual inspection clearly revealed a transparent solution, with no insoluble polymer and no turbidity.

The "dissolution time" for the polymer in butyl benzoate was evaluated using the following 4-step scale.

A: soluble (in not more than 180 minutes)
B: soluble (in more than 180 minutes but not more than 480 minutes)
C: soluble (in more than 480 minutes)
D: insoluble Soluble Concentration Test Coarse particles contained in the polymer were crushed using a mortar to convert the polymer to a powder having a uniform particle size. The polymer and butyl benzoate (25° C.) were added to a series of 6 ml screw-top vials to achieve amounts of the polymer relative to the mass of the solution of 4.0% by mass, 3.0% by mass, 2.0% by mass and 1.0% by mass, and the vials were shaken in an environment at 25° C. to ascertain whether or not the polymer would dissolve (soluble or insoluble). An evaluation of "soluble" was deemed to indicate a state where visual inspection clearly revealed a transparent solution, with no insoluble polymer and no turbidity.

The "soluble concentration" of the polymer in butyl benzoate was evaluated using the following 4-step scale.

A: polymer soluble at concentrations of 4.0% by mass and 3.0% by mass
B: polymer soluble at a concentration of 2.0% by mass, but insoluble at a concentration of 3.0% by mass
C: polymer soluble at a concentration of 1.0% by mass, but insoluble at a concentration of 2.0% by mass
D: polymer insoluble at a concentration of 1.0% by mass Curability Evaluation Using each of the polymers E1 to E19 and the polymers C1 to C15, an organic layer was formed, and the curability of the polymer (the solvent resistance of the organic layer) was evaluated in the manner described below.

Residual Film Ratio Test

The polymer (50.0 mg) and a polymerization initiator shown below (0.5 mg) were weighed into a 9 ml screw-top vial, and toluene (4,949.5 mg) was then added to dissolve the polymer and the polymerization initiator, thus preparing an ink composition. The ink composition was filtered through a polytetrafluoroethylene (PTFE) filter (pore size: 0.2 μm) and subsequently dripped onto a quartz substrate (length 22 mm×width 29 mm×thickness 0.7 mm), and a spin coater was used to form a coating film. Subsequently, the substrate was subjected to heat curing in the open atmosphere at 210° C. for 30 minutes, thereby forming an organic layer with a thickness of 30 nm on the quartz substrate.

[Chemical formula 23]

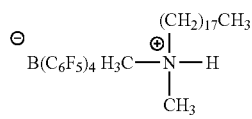

Polymerization initiator

Using a spectrophotometer (UV-2700, manufactured by Shimadzu Corporation), the absorbance A of the organic layer formed on the quartz substrate was measured. Following measurement, the substrate was immersed in toluene (10 ml, 25° C.) for 10 minutes in an environment at 25° C. with the organic layer facing upward. The absorbance B of the organic layer following the toluene immersion was then measured, and based on the absorbance A of the newly formed organic layer and the absorbance B of the organic layer following immersion, the formula shown below was used to calculate the film residual ratio. For each of the absorbance values, the value at the maximum absorption wavelength of the organic layer was used.

Residual Film Ratio (%)=(Absorbance $B$/Absorbance $A$)×100   [Numerical formula 2]

The residual film ratio was evaluated against the following 4-step scale. A higher residual film ratio indicates superior polymer curability and better solvent resistance for the organic layer.

A: residual film ratio of at least 99% but not more than 100%

B: residual film ratio of at least 90% but less than 99%

C: residual film ratio of at least 50% but less than 90%

D: residual film ratio of less than 50%

The results of the solubility evaluations and curability evaluation are shown in Table 3 and Table 4. In the tables, the symbol "-" means that the evaluation was not performed. Further, in the tables, a number of polymers are included more than once for the purpose of comparison.

TABLE 3

| | Solubility | | | | | | | | | | | | Curability |
|---|---|---|---|---|---|---|---|---|---|---|---|---|---|
| | Toluene | | | | | Anisole | | | | | Butyl benzoate | | |
| Example | Dissolution time (min) | Time reduction (%) | Comparative Example polymer | Dissolution time evaluation | Soluble concentration evaluation | Dissolution time (min) | Time reduction (%) | Comparative Example polymer | Dissolution time evaluation | Soluble concentration evaluation | Dissolution time evaluation | Soluble concentration evaluation | Residual film ratio Evaluation |
| Polymer E1 | 6.5 | 32 | Polymer C3 | C | A | 11 | 4 | Polymer C3 | F | A | D | D | A |
| Polymer E2 | 5.5 | 42 | Polymer C3 | B | A | 10 | 13 | Polymer C3 | E | A | D | D | A |
| Polymer E7 | 4 | 58 | Polymer C3 | A | A | 7 | 39 | Polymer C3 | C | A | B | A | A |
| Polymer E3 | 2 | 79 | Polymer C3 | A | A | 5.5 | 52 | Polymer C3 | A | A | A | A | C |
| Polymer E4 | 2.5 | 74 | Polymer C3 | A | A | 5.5 | 52 | Polymer C3 | A | A | A | A | B |
| Polymer E5 | 3 | 68 | Polymer C3 | A | A | 6 | 48 | Polymer C3 | B | A | A | A | B |
| Polymer E6 | 3.5 | 63 | Polymer C3 | A | A | 6.5 | 43 | Polymer C3 | B | A | A | A | A |
| Polymer E7 | 4 | 58 | Polymer C3 | A | A | 7 | 39 | Polymer C3 | C | A | B | A | A |
| Polymer E8 | 4 | 58 | Polymer C3 | A | A | 7.5 | 35 | Polymer C3 | C | A | B | A | A |
| Polymer E9 | 5.5 | 42 | Polymer C3 | B | A | 8.5 | 26 | Polymer C3 | D | A | C | C | A |
| Polymer E10 | 11 | 61 | Polymer C9 | A | A | 13 | 32 | Polymer C9 | C | A | D | D | A |
| Polymer E11 | 9.5 | 53 | Polymer C10 | A | A | — | — | — | — | — | — | — | A |
| Polymer E12 | 7 | 48 | Polymer C11 | B | A | 10 | 39 | Polymer C11 | C | A | A | A | A |
| Polymer E16 | 14 | 44 | Polymer C12 | B | A | 15 | 50 | Polymer C12 | A | A | D | D | A |
| Polymer E17 | 6 | 43 | Polymer C13 | B | A | 10 | 44 | Polymer C13 | B | A | D | D | A |
| Polymer E12 | 7 | 48 | Polymer C11 | B | A | 10 | 39 | Polymer C11 | C | A | A | A | A |
| Polymer E13 | 7 | 48 | Polymer C11 | B | A | 11 | 33 | Polymer C11 | C | A | A | A | A |
| Polymer E14 | 7.5 | 44 | Polymer C11 | B | A | 13 | 21 | Polymer C11 | D | A | A | A | A |
| Polymer E15 | 8.5 | 37 | Polymer C11 | C | A | 15 | 9 | Polymer C11 | F | A | A | B | A |
| Polymer E18 | 6 | 40 | Polymer C14 | B | A | — | — | — | — | — | A | B | A |
| Polymer E19 | 7.5 | 11 | Polymer C15 | E | A | 11.5 | 4 | Polymer C15 | F | A | D | D | C |

TABLE 4

| | Solubility | | | | | | | | | | | | Curability |
|---|---|---|---|---|---|---|---|---|---|---|---|---|---|
| | Toluene | | | | | Anisole | | | | | Butyl benzoate | | |
| Comparative Example | Dissolution time (min) | Time reduction (%) | Comparative Example polymer | Dissolution time evaluation | Soluble concentration evaluation | Dissolution time (min) | Time reduction (%) | Comparative Example polymer | Dissolution time evaluation | Soluble concentration evaluation | Dissolution time evaluation | Soluble concentration evaluation | Residual film ratio Evaluation |
| Polymer C1 | 9.5 | — | — | — | A | 13 | — | — | — | A | D | D | A |
| Polymer C2 | 14.5 | −53 | Polymer C3 | G | A | 16 | −39 | Polymer C3 | G | A | D | D | A |
| Polymer C3 | 9.5 | — | — | — | A | 11.5 | — | — | — | A | D | D | A |
| Polymer C4 | 13 | −37 | Polymer C3 | G | A | 13.5 | −17 | Polymer C3 | G | A | D | D | A |

TABLE 4-continued

| | Solubility | | | | | | | | | | | | |
|---|---|---|---|---|---|---|---|---|---|---|---|---|---|
| | Toluene | | | | | Anisole | | | | | Butyl benzoate | | |
| Comparative Example | Dissolution time (min) | Time reduction (%) | Comparative Example polymer | Dissolution time evaluation | Soluble concentration evaluation | Dissolution time (min) | Time reduction (%) | Comparative Example polymer | Dissolution time evaluation | Soluble concentration evaluation | Dissolution time evaluation | Soluble concentration evaluation | Curability Residual film ratio Evaluation |
| Polymer C5 | 12 | −26 | Polymer C3 | G | A | 30 | −161 | Polymer C3 | G | A | D | D | A |
| Polymer C6 | 10.5 | −11 | Polymer C3 | G | A | 16 | −39 | Polymer C3 | G | A | D | D | A |
| Polymer C7 | 9.5 | 0 | Polymer C3 | F | A | 12.5 | −9 | Polymer C3 | G | A | D | D | A |
| Polymer C8 | 18 | — | — | — | A | — | — | — | — | — | — | — | A |
| Polymer C9 | 28 | — | — | — | A | 19 | — | — | — | A | D | D | A |
| Polymer C10 | 20 | — | — | — | A | — | — | — | — | — | — | — | A |
| Polymer C11 | 13.5 | — | — | — | A | 16.5 | — | — | — | A | D | D | A |
| Polymer C12 | 25 | — | — | — | A | 30.3 | — | — | — | A | D | D | A |
| Polymer C13 | 10.5 | — | — | — | A | 18 | — | — | — | A | D | D | A |
| Polymer C14 | 10 | — | — | — | A | — | — | — | — | — | D | D | A |
| Polymer C15 | 8.5 | — | — | — | A | 12 | — | — | — | A | D | D | C |

The polymers of the examples exhibited excellent solubility in organic solvents. Further, the polymers of the examples had superior curability, and the organic layers formed using the polymers of the examples exhibited favorable solvent resistance.

Conductivity Evaluations and Thermal Stability Evaluations

Using each of the polymers E1 to E19 and the polymers C1 to C15, an evaluation device (hole-only-device (hereafter abbreviated as "HOD")) was produced, and the conductivity and thermal stability were evaluated in the manner described below. A cross-sectional schematic view of the HOD is illustrated in FIG. 1. In FIG. 1, 1 represents the substrate, 2 represents the anode, 3 represents the organic layer, and 4 represents the cathode.

Production of HOD

Production of HOD for Conductivity Evaluation

The polymer (50.0 mg) and a polymerization initiator shown below (0.5 mg) were weighed into a 9 ml screw-top vial, and toluene (2,449.5 mg) was then added to dissolve the polymer and the polymerization initiator, thus preparing an ink composition. The ink composition was filtered through a polytetrafluoroethylene (PTFE) filter (pore size: 0.2 μm). The ink composition was then dripped onto a quartz substrate (length 22 mm×width 29 mm×thickness 0.7 mm) on which an indium tin oxide (ITO) electrode had been patterned with a width of 1.6 mm (hereafter referred to as the "ITO substrate"), and a spin coater was used to form a coating film. Subsequently, the substrate was subjected to heat curing in the open atmosphere at 210° C. for 30 minutes, thereby forming an organic layer with a thickness of 100 nm on the ITO substrate.

[Chemical formula 24]

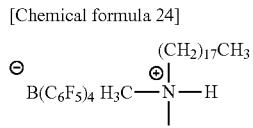

Polymerization initiator

Subsequently, the ITO substrate was transferred into a vacuum deposition apparatus, a deposition method was used to form an aluminum (Al) electrode with a thickness of 100 nm on top of the formed organic layer, and an encapsulation treatment was then performed to complete production of an HOD for conductivity evaluation.

Production of HOD for Thermal Stability Evaluation 1

With the exception of performing additional heating under a nitrogen atmosphere at 200° C. for 60 minutes following the heat curing described above, thereby forming an organic layer with a thickness of 100 nm on the ITO substrate, an HOD for a thermal stability evaluation 1 was produced in the same manner as the production of the HOD for conductivity evaluation.

Production of HOD for Thermal Stability Evaluation 2

With the exception of performing additional heating under a nitrogen atmosphere at 230° C. for 60 minutes following the heat curing described above, thereby forming an organic layer with a thickness of 100 nm on the ITO substrate, an HOD for a thermal stability evaluation 2 was produced in the same manner as the production of the HOD for conductivity evaluation.

Conductivity Evaluations

A voltage was applied to the HOD for conductivity evaluation produced above to evaluate the conductivity.

Conductivity 1

Whether or not the HOD exhibited conductivity was evaluated against the following 2-step scale. An evaluation result of A indicates that the organic layer has a hole injection function.
A: conductivity—yes
B: conductivity—no

Conductivity 2

The applied voltage was varied, and the voltage at a current density of 300 mA/cm$^2$ was measured. The conductivity was evaluated against the following 3-step scale.
A: voltage of less than 3.00 V
B: voltage of at least 3.00 V but less than 5.00 V
C: voltage of 5.00 V or greater

Thermal Stability Evaluations

Thermal Stability Evaluation 1

A voltage was applied to the HOD for thermal stability evaluation 1 produced in the manner described above, the applied voltage was varied, and the voltage at a current density of 300 mA/cm$^2$ was measured. Based on the voltage difference between the HOD for conductivity evaluation and the HOD for thermal stability evaluation 1, the thermal stability was evaluated against the following 5-step scale. The voltage difference was calculated using the formula shown below. A smaller voltage difference indicates superior heat resistance.

Voltage difference (V)=(voltage of HOD for thermal stability evaluation 1 (V))−(voltage of HOD for conductivity evaluation (V))    [Numerical formula 3]

A: voltage difference of less than 0.20 V
B: voltage difference of at least 0.20 V but less than 0.50 V
C: voltage difference of at least 0.50 V but less than 1.00 V
D: voltage difference of at least 1.00 V but less than 2.00 V
E: voltage difference of 2.00 V or greater

Thermal Stability Evaluation 2

A voltage was applied to the HOD for thermal stability evaluation 2 produced in the manner described above, the applied voltage was varied, and the voltage at a current density of 300 mA/cm$^2$ was measured. Based on the voltage difference between the HOD for conductivity evaluation and the HOD for thermal stability evaluation 2, the thermal stability was evaluated against the following 5-step scale. The voltage difference was calculated using the formula shown below. A smaller voltage difference indicates superior heat resistance.

Voltage difference (V)=(voltage of HOD for thermal stability evaluation 2 (V))−(voltage of HOD for conductivity evaluation (V))    [Numerical formula 4]

A: voltage difference of less than 0.20 V
B: voltage difference of at least 0.20 V but less than 0.50 V
C: voltage difference of at least 0.50 V but less than 1.00 V
D: voltage difference of at least 1.00 V but less than 2.00 V
E: voltage difference of 2.00 V or greater The results for the conductivity evaluations and the heat resistance evaluations are shown in Table 5 and Table 6.

TABLE 5

| | Conductivity | | | Thermal stability 1 | | | Thermal stability 2 | | |
| | | | | Voltage difference | | | Voltage difference | | |
| | Conductivity 2 | | | | | | | | |
| Example | Conductivity 1 Evaluation | Voltage (1) (V) | Evaluation | Voltage (2) (V) | (2) − (1) (V) | Evaluation | Voltage (3) (V) | (3) − (1) (V) | Evaluation |
|---|---|---|---|---|---|---|---|---|---|
| Polymer E1 | A | 1.85 | A | 1.9 | 0.05 | A | 2.1 | 0.25 | B |
| Polymer E2 | A | 1.85 | A | 1.85 | 0 | A | 1.95 | 0.1 | A |
| Polymer E7 | A | 1.85 | A | 1.85 | 0 | A | 2.05 | 0.2 | B |
| Polymer E3 | A | 1.85 | A | 1.85 | 0 | A | 1.9 | 0.05 | A |
| Polymer E4 | A | 1.85 | A | 1.85 | 0 | A | 1.9 | 0.05 | A |
| Polymer E5 | A | 1.85 | A | 1.85 | 0 | A | 1.9 | 0.05 | A |
| Polymer E6 | A | 1.85 | A | 1.85 | 0 | A | 1.95 | 0.1 | A |
| Polymer E7 | A | 1.85 | A | 1.85 | 0 | A | 2.05 | 0.2 | B |
| Polymer E8 | A | 1.9 | A | 1.9 | 0 | A | 2.2 | 0.3 | B |
| Polymer E9 | A | 2.0 | A | 2.1 | 0.1 | A | 2.5 | 0.5 | B |
| Polymer E10 | A | 1.9 | A | 1.9 | 0 | A | 2.05 | 0.15 | A |
| Polymer E11 | A | 1.95 | A | 1.95 | 0 | A | 2.1 | 0.15 | A |
| Polymer E12 | A | 1.9 | A | 1.9 | 0 | A | 1.9 | 0 | A |
| Polymer E16 | A | 2.15 | A | 2.15 | 0 | A | 2.15 | 0 | A |
| Polymer E17 | A | 2.1 | A | 2.1 | 0 | A | 2.1 | 0 | A |
| Polymer E12 | A | 1.9 | A | 1.9 | 0 | A | 1.9 | 0 | A |
| Polymer E13 | A | 1.9 | A | 1.9 | 0 | A | 1.9 | 0 | A |
| Polymer E14 | A | 2.0 | A | 2.0 | 0 | A | 2.0 | 0 | A |
| Polymer E15 | A | 1.95 | A | 1.95 | 0 | A | 2.0 | 0.05 | A |
| Polymer E18 | A | 3.2 | B | 3.2 | 0 | A | 3.25 | 0.05 | A |
| Polymer E19 | A | 1.95 | A | 1.95 | 0 | A | 3.3 | 1.35 | D |

TABLE 6

| Comparative Example | Conductivity Conductivity 1 evaluation | Conductivity 2 Voltage (1) (V) | evaluation | Thermal stability Thermal stability 1 Voltage difference Voltage (2) (V) | (2) − (1) (V) | evaluation | Thermal stability 2 Voltage difference Voltage (3) (V) | (3) − (1) (V) | evaluation |
|---|---|---|---|---|---|---|---|---|---|
| Polymer C1 | A | 2.05 | A | 2.3 | 0.25 | B | 4.8 | 2.75 | E |
| Polymer C2 | A | 1.95 | A | 1.95 | 0 | A | 2.35 | 0.4 | B |
| Polymer C3 | A | 2.05 | A | 2.3 | 0.25 | B | 4.4 | 2.35 | E |
| Polymer C4 | A | 1.95 | A | 2.2 | 0.25 | B | 2.35 | 0.4 | B |
| Polymer C5 | A | 1.95 | A | 2.0 | 0.05 | A | 2.35 | 0.4 | B |
| Polymer C6 | A | 1.85 | A | 1.85 | 0 | A | 2.05 | 0.2 | B |
| Polymer C7 | A | 1.85 | A | 1.85 | 0 | A | 2.0 | 0.15 | A |
| Polymer C8 | A | 2.0 | A | 2.3 | 0.3 | B | 4.9 | 2.9 | E |
| Polymer C9 | A | 2.0 | A | 2.2 | 0.2 | B | 4.0 | 2.0 | E |
| Polymer C10 | A | 1.95 | A | 2.2 | 0.25 | B | 4.1 | 2.15 | E |
| Polymer C11 | A | 1.85 | A | 1.95 | 0.1 | A | 4.35 | 2.5 | E |
| Polymer C12 | A | 2.0 | A | 2.0 | 0 | A | 3.0 | 1.0 | D |
| Polymer C13 | A | 1.85 | A | 1.95 | 0.1 | A | 4.3 | 2.45 | E |
| Polymer C14 | A | 3.0 | B | 3.1 | 0.1 | A | 3.95 | 0.95 | C |
| Polymer C15 | A | 2.0 | A | 2.2 | 0.2 | B | 6.0 | 4.0 | E |

The organic layers formed using the polymers of the examples had excellent conductivity and thermal stability. Further, the organic electronic elements containing the organic layers exhibited excellent conductivity and thermal stability.

INDUSTRIAL APPLICABILITY

A charge transport polymer according to one embodiment is a polymer material that is suitable for wet processes, and can be used favorably for producing an organic electronic material using a wet process. Further, according to another embodiment, an organic layer formed using the charge transport polymer enables improvements in the characteristics of an organic electronic element.

REFERENCE SIGNS LIST

1: Substrate
2: Anode
3: Organic layer
4: Cathode

The invention claimed is:
1. A charge transport polymer comprising a molecular chain and terminal groups bonded to the molecular chain, wherein
the charge transport polymer is a branched polymer and has a structure branched in three or more directions,
the terminal groups comprise a terminal group P containing a polymerizable functional group and a terminal group EW containing an aromatic hydrocarbon group substituted with an electron-withdrawing substituent,
among carbon atoms contained in a ring of the aromatic hydrocarbon group, when a carbon atom that is bonded to the molecular chain is numbered 1, and numbers are assigned in order to adjoining carbon atoms, then the electron-withdrawing substituent is bonded to a carbon atom numbered 1+2n (wherein n is an integer of 1 or greater),
the terminal group P comprises at least a terminal group represented by formula (P2) shown below,

$$*-(Ar)_a-[(X)_b(Y)_c-PG]_d \quad (P2)$$

wherein in formula (P2), Ar represents unsubstituted benzene ring, X represents a divalent group represented by any one of formulas (X1) to (X10) shown below, Y represents an alkylene group of 1 to 10 carbon atoms, PG represents a substituted or unsubstituted polymerizable functional group, the polymerizable functional group contains at least one selected from the group consisting of a group having a carbon-carbon double bond and a cyclic ether group, a represents 1, each b and c independently represents 0 or 1, d represents 1 or 2,

  (X1)

  (X2)

  (X3)

  (X4)

  (X5)

  (X6)

  (X7)

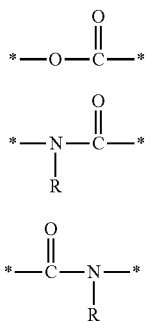

(X8)

(X9)

(X10)

wherein in formulas (X1) to (X10), each R independently represents a hydrogen atom, a linear, cyclic or branched alkyl group of 1 to 22 carbon atoms, or an aryl group or heteroaryl group of 2 to 30 carbon atoms, provided formula (P2) does not include a partial structure represented by —Ar—CH$_2$—O— the terminal group EW comprises at least one selected from the group consisting of a group represented by formula (EW1), a group represented by formula (EW3), a group represented by formula (EW4), and a group represented by formula (EW5) shown below,

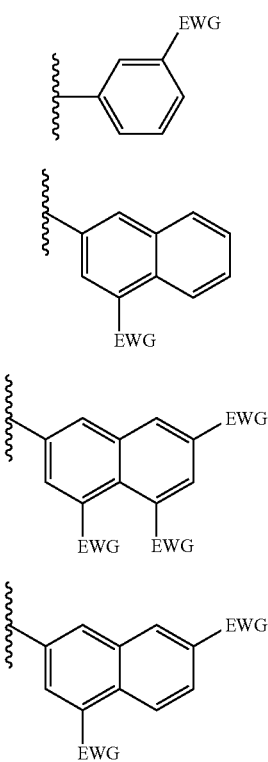

(EW1)

(EW3)

(EW4)

(EW5)

wherein in formulas (EW1) and (EW3) to (EW5), each EWG independently represents an electron-withdrawing substituent.

2. The charge transport polymer according to claim 1, comprising from 3 to 60 mol % of structural units containing the terminal groups, based on all structural units of the charge transport polymer.

3. The charge transport polymer according to claim 1, wherein the electron-withdrawing substituent contains at least one type of group selected from the group consisting of halogen groups, halogen-substituted alkyl groups, a nitro group, a cyano group, a sulfonate group and a sulfoxide group.

4. The charge transport polymer according to claim 1, comprising from 15 to 95 mol % of the terminal group EW, based on all of the terminal groups.

5. The charge transport polymer according to claim 1, comprising at least one type of structure selected from the group consisting of substituted or unsubstituted aromatic amine structures, substituted or unsubstituted carbazole structures, substituted or unsubstituted thiophene structures, substituted or unsubstituted bithiophene structures, substituted or unsubstituted benzene structures and substituted or unsubstituted fluorene structures.

6. A charge transport material comprising the charge transport polymer according to claim 1.

7. An ink composition comprising the charge transport polymer according to claim 1.

8. An organic layer formed using the charge transport polymer according to claim 1.

9. An organic electronic element having the organic layer according to claim 8.

10. An organic electroluminescent element having the organic layer according to claim 8.

11. A display element comprising the organic electroluminescent element according to any claim 10.

12. An illumination device comprising the organic electroluminescent element according to claim 10.

13. A display device comprising the illumination device according to claim 12, and a liquid crystal element as a display unit.

14. An ink composition comprising the charge transport material according to claim 6, and a solvent.

15. An organic layer formed using the charge transport material according to claim 6.

16. An organic layer formed using the ink composition according to claim 7.

17. The charge transport polymer according to claim 1, wherein the charge transport polymer has a structure branched in three directions.

18. The charge transport polymer according to claim 1, wherein the charge transport polymer has a structure branched in more than three directions.

19. The charge transport polymer according to claim 1, wherein the polymerizable functional group contains a group having a carbon-carbon double bond.

20. The charge transport polymer according to claim 1, wherein the polymerizable functional group contains a cyclic ether group.

* * * * *